United States Patent
Boehmer et al.

(10) Patent No.: US 9,317,472 B2
(45) Date of Patent: Apr. 19, 2016

(54) PROCESSING ELEMENT DATA SHARING

(71) Applicant: International Business Machines Corporation, Armonk, NY (US)

(72) Inventors: Joerg Boehmer, Berlin (DE); Torsten Golz, Berlin (DE); Sanjeev Kumar, Pune (IN); Ronald Nordhausen, Berlin (DE); Paul Zollna, Berlin (DE)

(73) Assignee: International Business Machines Corporation, Armonk, NY (US)

( * ) Notice: Subject to any disclaimer, the term of this patent is extended or adjusted under 35 U.S.C. 154(b) by 400 days.

(21) Appl. No.: 13/912,735

(22) Filed: Jun. 7, 2013

(65) Prior Publication Data
US 2014/0365597 A1    Dec. 11, 2014

(51) Int. Cl.
*G06F 15/173*    (2006.01)
*G06F 12/10*    (2006.01)

(52) U.S. Cl.
CPC ...... *G06F 15/17331* (2013.01); *G06F 12/1072* (2013.01)

(58) Field of Classification Search
CPC .................. G06F 15/17331; G06F 12/1072
See application file for complete search history.

(56) References Cited

U.S. PATENT DOCUMENTS

| | | | | |
|---|---|---|---|---|
| 4,819,159 A * | 4/1989 | Shipley | ............... | G06F 11/1471 707/E17.007 |
| 5,909,540 A * | 6/1999 | Carter | ................... | G06F 9/5016 707/E17.12 |
| 5,918,229 A * | 6/1999 | Davis | ..................... | G06F 9/5016 705/27.1 |
| 6,151,304 A * | 11/2000 | Doshi | ..................... | G06F 17/10 370/216 |
| 6,314,555 B1 * | 11/2001 | Ndumu | ..................... | G06F 8/10 706/49 |
| 6,898,657 B2 | 5/2005 | Smith | | |
| 6,925,547 B2 * | 8/2005 | Scott | ................... | G06F 12/1072 370/389 |
| 7,356,026 B2 * | 4/2008 | Scott | ................... | G06F 12/1072 370/389 |
| 7,577,667 B2 * | 8/2009 | Hinshaw | | |
| 7,694,170 B2 * | 4/2010 | Callaway | ............ | G06F 11/1641 714/4.1 |
| 7,890,733 B2 | 2/2011 | McConnell | | |
| 7,966,340 B2 * | 6/2011 | Friedman | .......... | G06F 17/30445 707/764 |
| 8,214,686 B2 * | 7/2012 | Ueda | ..................... | G06F 9/4856 714/15 |
| 9,052,993 B2 * | 6/2015 | Suzuki | ................ | G06F 12/0842 |
| 2002/0169938 A1 * | 11/2002 | Scott | ................... | G06F 12/1072 711/207 |
| 2002/0172199 A1 * | 11/2002 | Scott | ................... | G06F 12/1072 370/389 |
| 2003/0023702 A1 * | 1/2003 | Kokku | ..................... | H04L 29/06 709/216 |
| 2005/0289143 A1 * | 12/2005 | Oshri | ................ | G06F 17/30171 |
| 2006/0242464 A1 * | 10/2006 | Holt | ........................ | G06F 15/16 714/25 |
| 2008/0028136 A1 * | 1/2008 | Schakel | .............. | G06F 13/1636 711/106 |
| 2008/0195616 A1 * | 8/2008 | Rowley | ............. | G06F 17/30362 |
| 2008/0256167 A1 * | 10/2008 | Branson | ................ | G06F 9/5027 709/201 |
| 2014/0040220 A1 * | 2/2014 | Kimura | ............. | G06F 17/30008 707/704 |
| 2014/0122790 A1 * | 5/2014 | Lasserre | .......... | G11C 11/40611 711/106 |
| 2014/0237071 A1 * | 8/2014 | Friman | ............. | G06F 17/30902 709/216 |
| 2014/0310317 A1 * | 10/2014 | Spillane | ............ | G06F 17/30961 707/803 |

* cited by examiner

*Primary Examiner* — Jimmy H Tran
(74) *Attorney, Agent, or Firm* — Schmeiser, Olsen & Watts; John Pivnichny

(57) ABSTRACT

A memory sharing method and system in a distributed computing environment. The method includes placing a first operator and a second operator within a processing element. The first operator is associated with a first host and the second operator associated with a second and differing host of a distributed computing system. Requests for usage of global data with respect to multiple processes are received from the first operator and the second operator. The global data is stored within a specified segment of a shared memory module that includes shared memory space being shared by the first operator and the second operator. The multiple processes are executed and results are generated by the first operator and the second operator with respect to the global data.

20 Claims, 21 Drawing Sheets

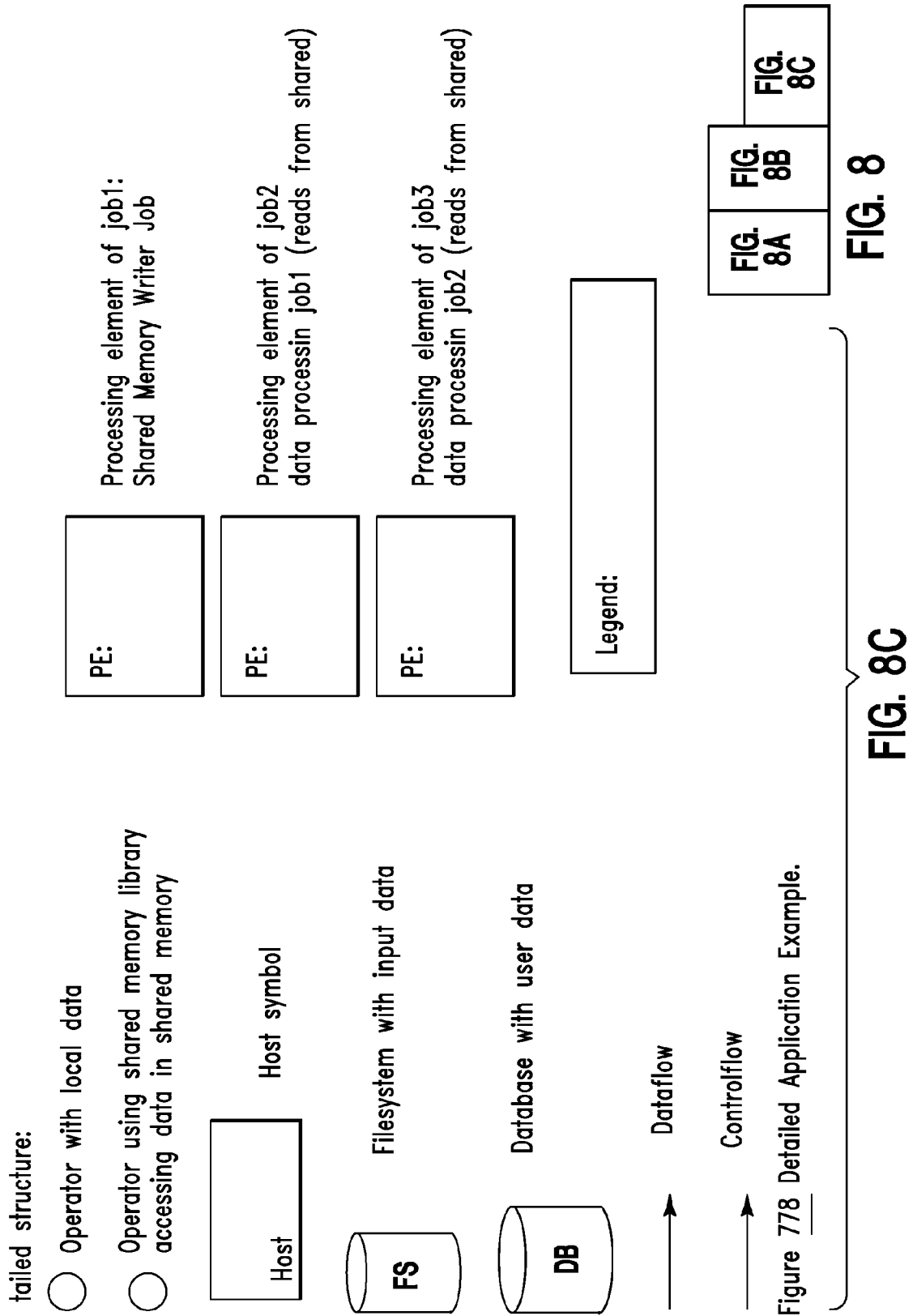

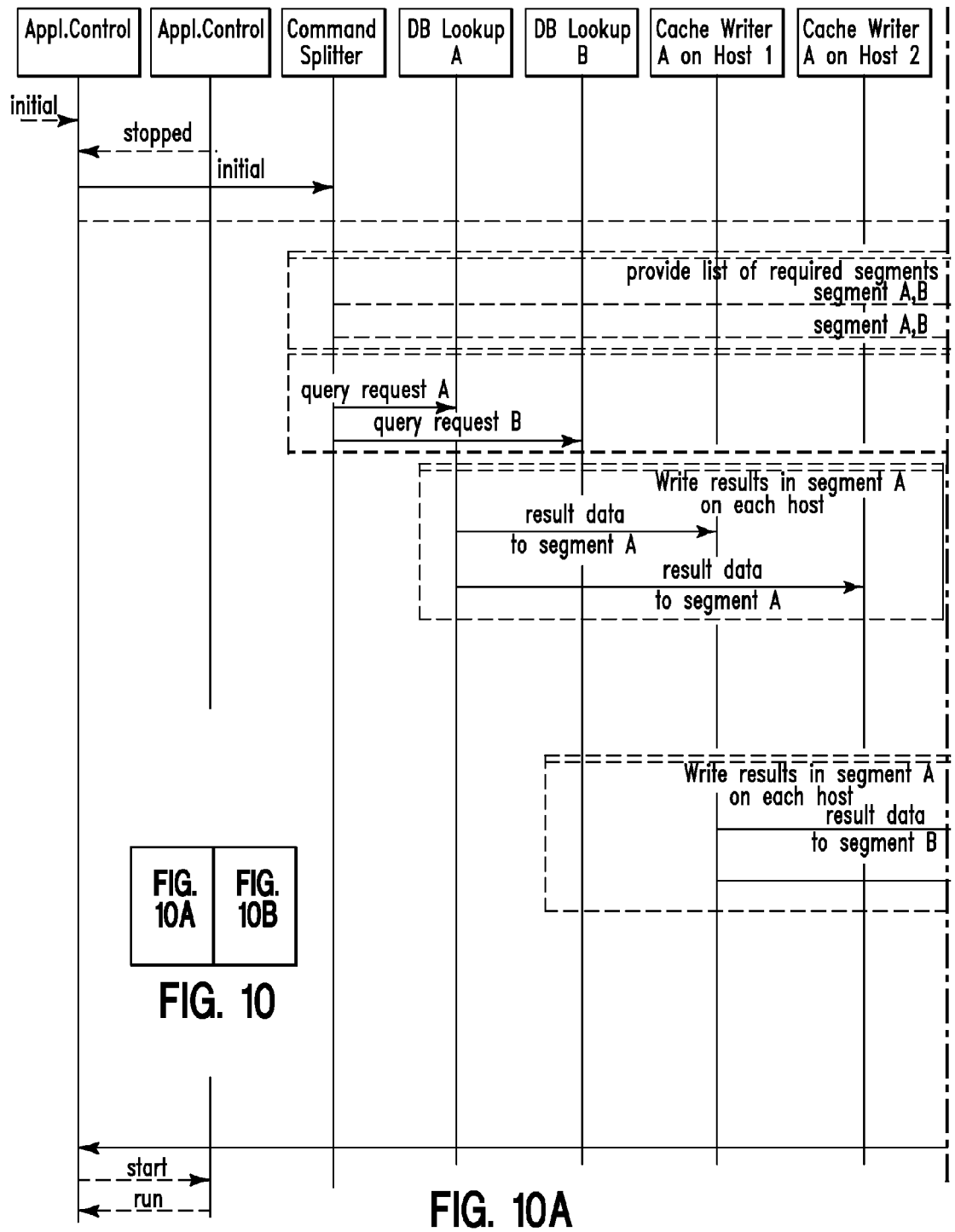

1000

US 9,317,472 B2

PROCESSING ELEMENT DATA SHARING

FIELD

One or more embodiments of the invention relates generally to a method and associated system for sharing data between processing elements in a distributed computation system, and in particular to a method and associated system for sharing global data stored in a shared memory module.

BACKGROUND

Multiple device access to data typically includes an inaccurate process with little flexibility. Sharing multiple device accessed data may include a complicated process that may be time consuming and require a large amount of resources. Accordingly, there exists a need in the art to overcome at least some of the deficiencies and limitations described herein above.

SUMMARY

A first embodiment of the invention provides a method comprising: placing, by a computer processor, a first operator and a second operator within a first processing element, the first operator comprising first local data, the second operator comprising second local data, the first operator associated with a first host of a distributed computing system, the second operator associated with a second host of the distributed computing system, the first host differing from the second host; receiving, by the computer processor from the first operator within the first processing element, a first request for usage of first global data with respect to a first process, the first global data semi-persistently stored within a specified segment of a shared memory module; first executing in response to the first request, by the computer processor executing the first operator within the first processing element, the first process with respect to the first global data semi-persistently stored within the specified portion of the shared memory module; generating, by the computer processor, results of the first executing; receiving, by the computer processor from the second operator within the first processing element, a second request for usage of the first global data with respect to a second process differing from the first process; second executing in response to the second request, by the computer processor executing the second operator within the second processing element, the second process with respect to the first global data semi-persistently stored within the specified segment of the shared memory module, wherein the shared memory module comprises shared memory space being shared by the first operator and the second operator; and generating, by the computer processor, results of the second executing.

A second embodiment of the invention provides a computer program product, comprising a computer readable hardware storage device storing a computer readable program code, the computer readable program code comprising an algorithm that when executed by a computer processor of a computer system implements a method, the method comprising: placing, by the computer processor, a first operator and a second operator within a first processing element, the first operator comprising first local data, the second operator comprising second local data, the first operator associated with a first host of a distributed computing system, the second operator associated with a second host of the distributed computing system, the first host differing from the second host; receiving, by the computer processor from the first operator within the first processing element, a first request for usage of first global data with respect to a first process, the first global data semi-persistently stored within a specified segment of a shared memory module; first executing in response to the first request, by the computer processor executing the first operator within the first processing element, the first process with respect to the first global data semi-persistently stored within the specified portion of the shared memory module generating, by the computer processor, results of the first executing; receiving, by the computer processor from the second operator within the first processing element, a second request for usage of the first global data with respect to a second process differing from the first process; second executing in response to the second request, by the computer processor executing the second operator within the second processing element, the second process with respect to the first global data semi-persistently stored within the specified segment of the shared memory module, wherein the shared memory module comprises shared memory space being shared by the first operator and the second operator; and generating, by the computer processor, results of the second executing.

A third embodiment of the invention provides a computer system comprising a computer processor coupled to a computer-readable memory unit, the memory unit comprising instructions that when executed by the computer processor implements a method comprising: placing, by the computer processor, a first operator and a second operator within a first processing element, the first operator comprising first local data, the second operator comprising second local data, the first operator associated with a first host of a distributed computing system, the second operator associated with a second host of the distributed computing system, the first host differing from the second host; receiving, by the computer processor from the first operator within the first processing element, a first request for usage of first global data with respect to a first process, the first global data semi-persistently stored within a specified segment of a shared memory module; first executing in response to the first request, by the computer processor executing the first operator within the first processing element, the first process with respect to the first global data semi-persistently stored within the specified portion of the shared memory module; generating, by the computer processor, results of the first executing; receiving, by the computer processor from the second operator within the first processing element, a second request for usage of the first global data with respect to a second process differing from the first process; second executing in response to the second request, by the computer processor executing the second operator within the second processing element, the second process with respect to the first global data semi-persistently stored within the specified segment of the shared memory module, wherein the shared memory module comprises shared memory space being shared by the first operator and the second operator; and generating, by the computer processor, results of the second executing.

The present invention advantageously provides a simple method and associated system capable of sorting data.

BRIEF DESCRIPTION OF THE DRAWINGS

FIG. 8, including FIGS. 8A-8C, illustrates a system for implementing a shared memory access process, in accordance with embodiments of the present invention.

FIG. 10, including FIGS. 10A-10B, illustrates an algorithm detailing a shared memory initial sequence flow chart, in accordance with embodiments of the present invention.

DETAILED DESCRIPTION

Figure 1:
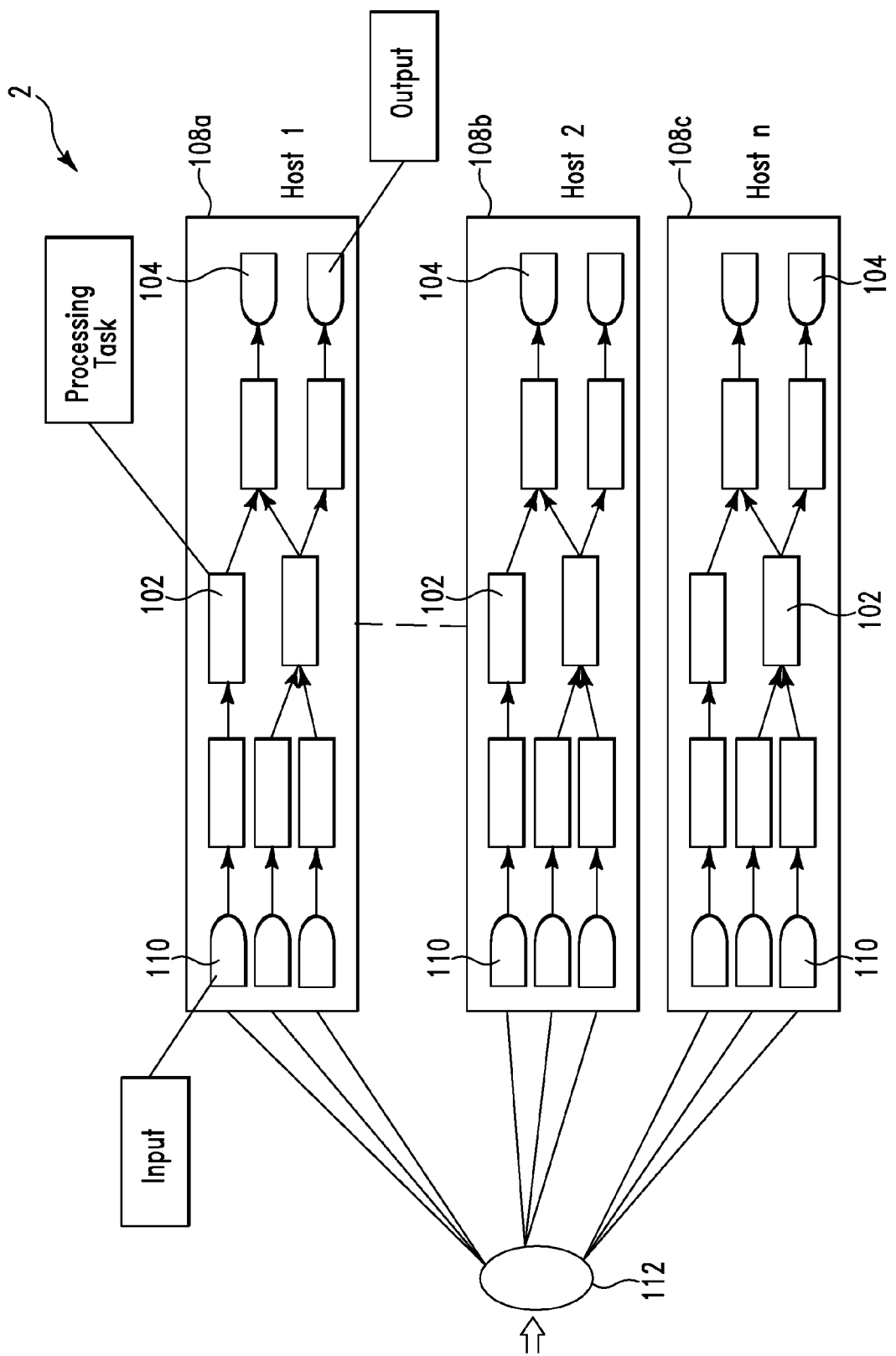
FIG. 1 illustrates a system for implementing a distributed computing environment, in accordance with embodiments of the present invention.

FIG. 1 illustrates a system 2 for implementing a distributed computing environment, in accordance with embodiments of the present invention. System 2 enables usage of a distributed system allowing data exchange between operators across processing elements/clusters thereby reducing data retrieval/sharing time. A processing element is defined herein as a software logical unit defined by an operating sub-system for managing a cluster of CPUs for distributed processing. One or more processing elements (each comprising at least one operator) may be deployed within a CPU of a cluster. System 2 enables a process for sharing data between the processing elements and also preventing collisions and overwriting of any shared data.

System 2 comprises synchronization mechanisms for avoiding conflicts between requesting processes. System 2 comprises a complex task 112 broken into multiple sub-tasks distributed across multiple host machines 108a . . . 108c each running multiple computational chains. Each of host machines 108a . . . 108c comprises inputs 110, processing tasks 102, and outputs 104. Within each of host machines 108a . . . 108c, a computing task encapsulates each processing task 102 into an operator. Operators are connected via a chain (e.g., a stream) which carries data between the operators. Operators are restricted to use only data from input streams and other local data. Streams may cross processes and hosts thereby allowing for relocation of operators arbitrarily. Streams include a sequence of small portions of data (i.e., tuples) and each processing step of system 2 executes one tuple.

Figure 2:
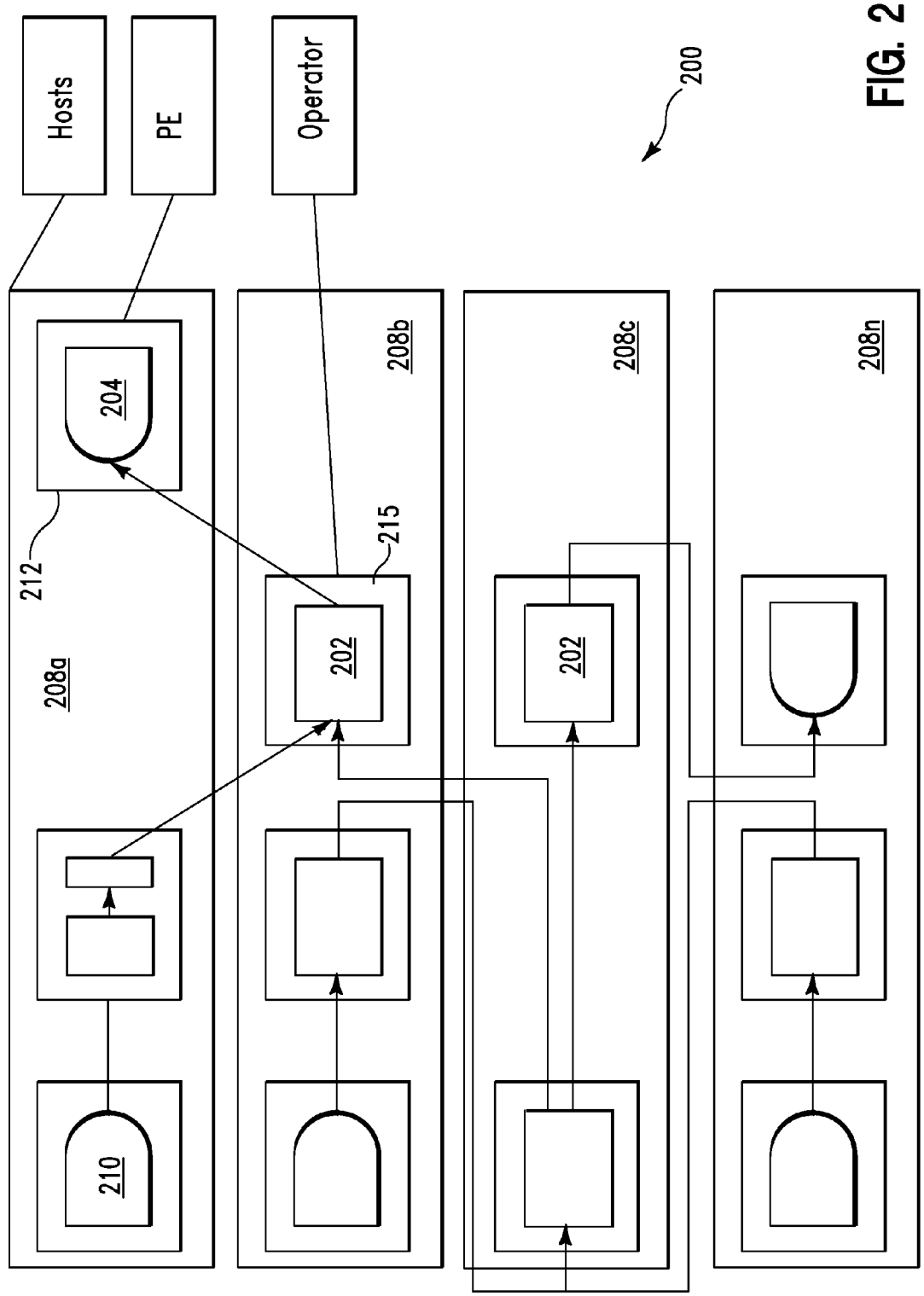
FIG. 2 illustrates a system for implementing the distributed computing environment of FIG. 1, in accordance with embodiments of the present invention.

FIG. 2 illustrates a system 200 for implementing the distributed computing environment of FIG. 1, in accordance with embodiments of the present invention. System 200 illustrates operators 215 executed within processing elements 212 within streams. A processing element conforms to a process of an operating system. A processing element may contain one or more operators and initiates at least one processing thread. Operators may be executed in a separate processing element. Alternatively, several operators may be fused within one processing elements depending on required performance. System 200 additionally comprises hosts 208a . . . 208n, processing tasks 202, inputs 210, and outputs 204.

Figure 3:
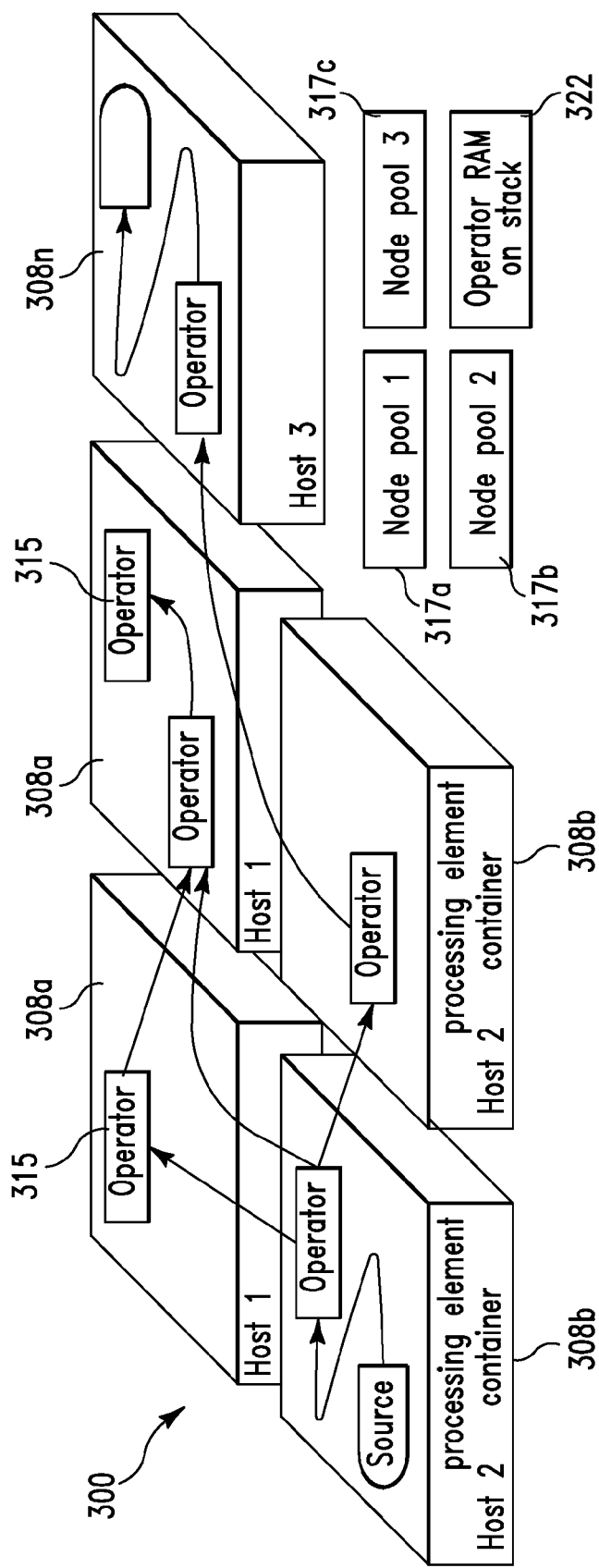
FIG. 3 illustrates a system for implementing memory and process distribution within host machines in a distributed computing environment, in accordance with embodiments of the present invention.

FIG. 3 illustrates a system 300 for implementing memory and process distribution within the host machines 308a . . . 308n in a distributed environment, in accordance with embodiments of the present invention. A smallest operational unit or operator 315 comprises a source, sink or other operator. Operators 315 may store data locally on a RAM stack 322. The data is forwarded to other parameters by a streams channel. Operators 315 may be started within a same process by fusing within a processing element. The processing elements may be initiated on a same host or distributed to another host.

Figure 4:
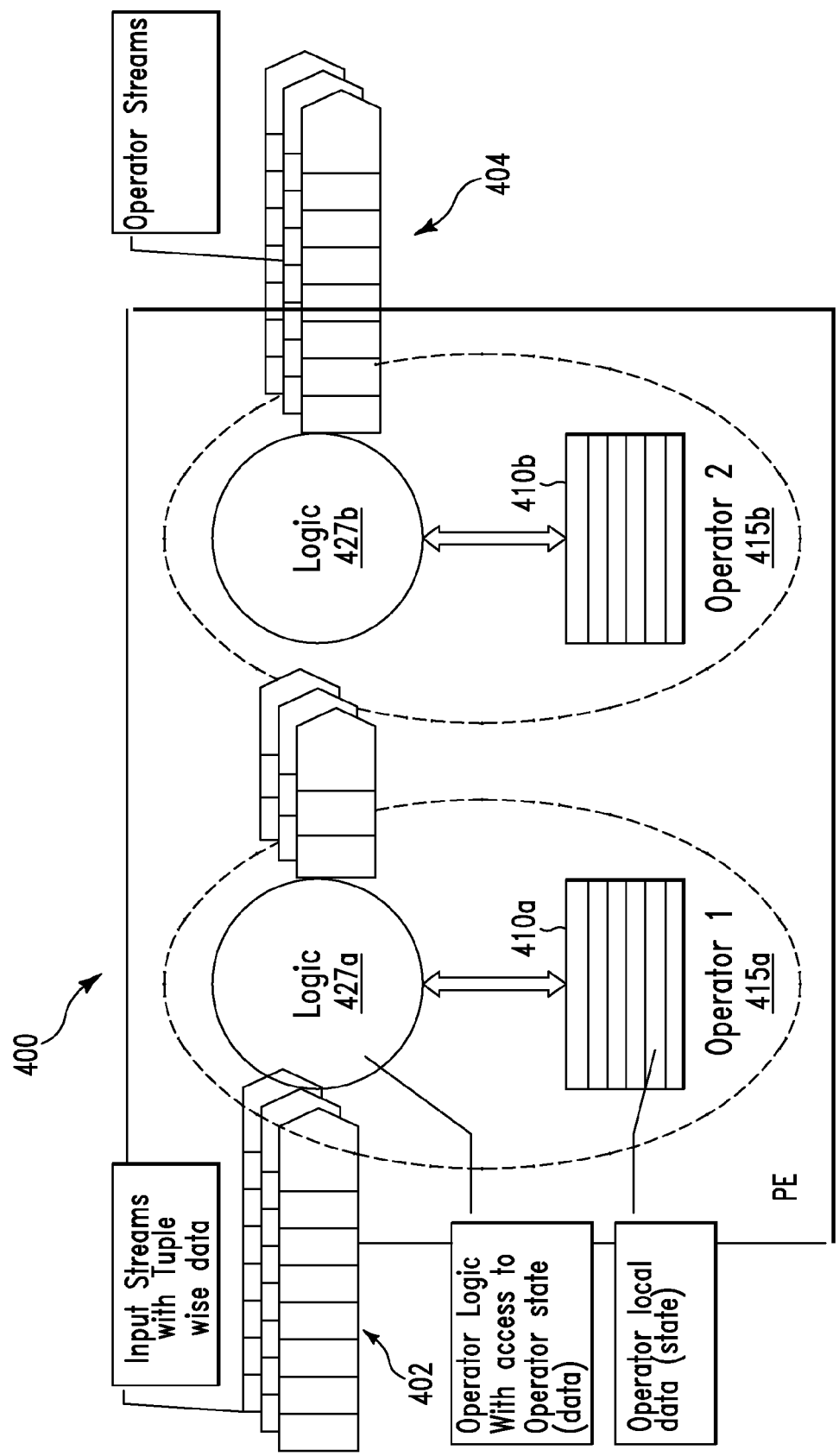
FIG. 4 illustrates a system for implementing a data model comprising computational operators in distributed computing, in accordance with embodiments of the present invention.

FIG. 4 illustrates a system 400 for implementing a data model comprising computational operators in distributed computing, in accordance with embodiments of the present invention. System 400 of FIG. 4 illustrates an input stream 402, and output stream 404, and operators 415a and 415b (and associated logic 427a and 427b) each building an associated local memory stack 410a and 410b.

Figure 5:
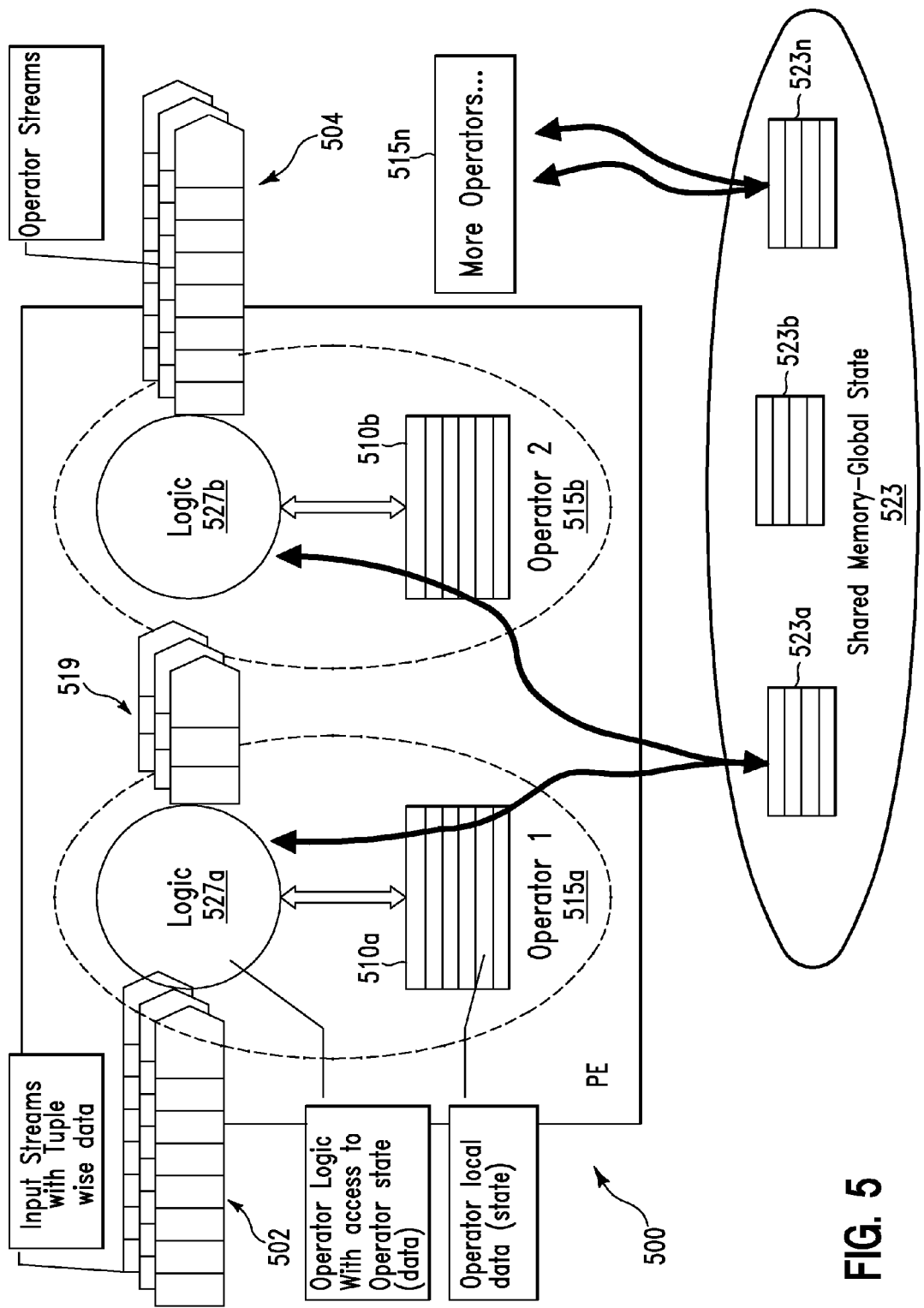
FIG. 5 illustrates a system for implementing an operator model enhanced by shared memory access, in accordance with embodiments of the present invention.

FIG. 5 illustrates a system 500 for implementing an operator model enhanced by shared memory access, in accordance with embodiments of the present invention. System 500 enables usage of a shared memory (SHM) module in a distributed system allowing in-memory data exchange between operators across processing elements/clusters thereby reducing data retrieval/sharing time. System 500 enables a process for sharing of common a cache between the processing elements and also preventing collisions and overwriting of any shared data. System 500 allows consumption of available RAM from other nodes of a cluster for deploying in-memory cache across the nodes. System 500 comprises synchronization mechanisms for avoiding conflicts between requesting processes. An SHM module enables an inter-process cache memory to allow for data exchange between data stream operators deployed across different processing elements across multiple data stream jobs. A SHM module comprises semi-persistent storage for operators running in different or the same processing elements.

System 500 of FIG. 5 illustrates an input stream 502, and output stream 504, and operators 515a and 515b (and associated logic 527a and 527b) each building an associated local memory stack 510a and 510b and associated with shared memory 523. Additionally, operators 515n have access to shared memory 523. Commonly used data is stored within shared memory 523. Associated logic 527a and 527b library comprises functionality for enabling shared memory access.

Shared memory 523 is organized in segments 523a . . . 523n. A shared memory segment provides space for the shared memory stores. A shared memory segment may comprise one or more shared memory stores. A shared memory store comprises a container for data storage. Operators 515a and 515b may have access to one or more shared memory stores/segments.

Figure 6:
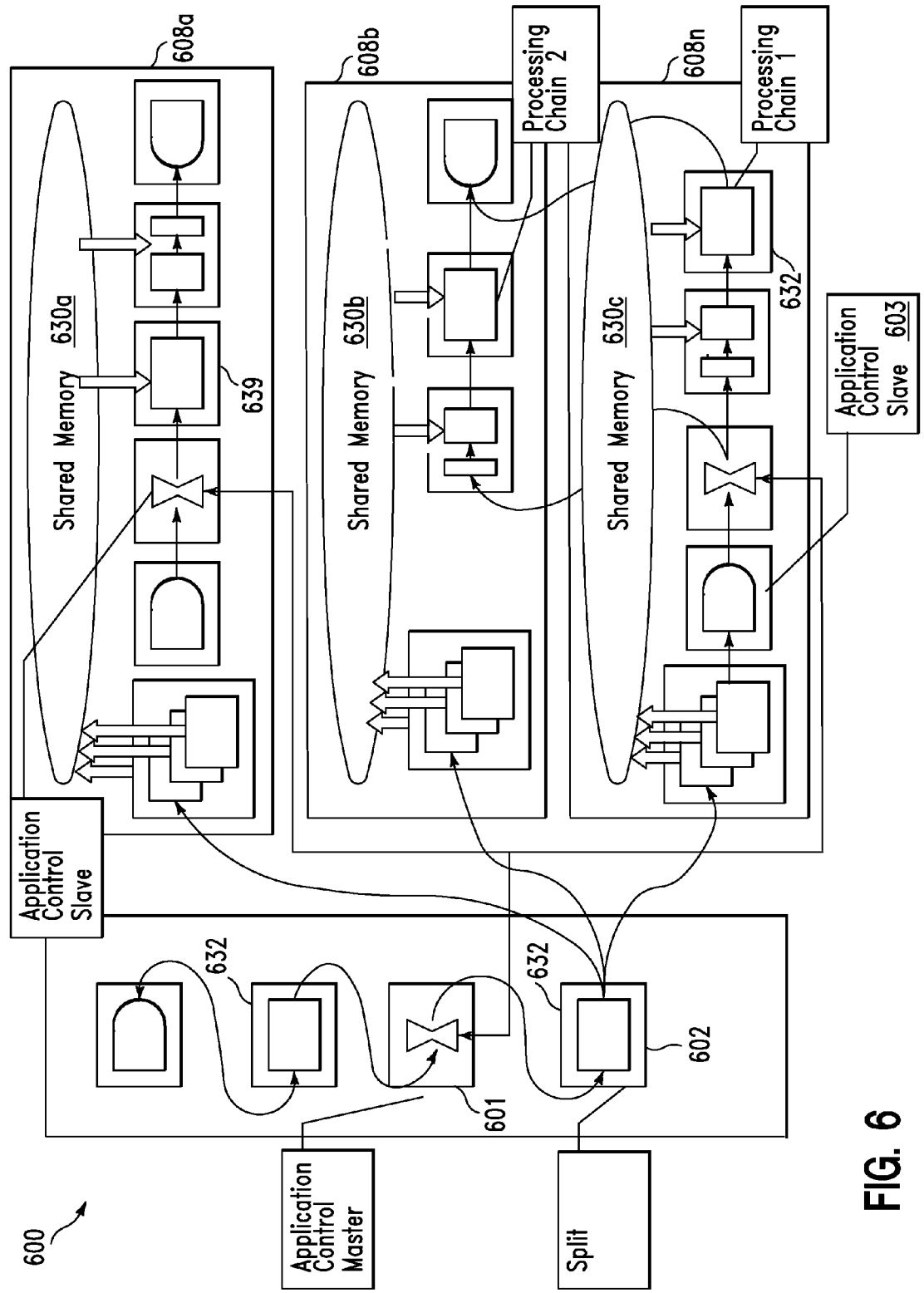
FIG. 6 illustrates a system for implementing deployment of multiple jobs with distributed shared memory access, in accordance with embodiments of the present invention.

FIG. 6 illustrates a system 600 for implementing deployment of multiple jobs and multiple hosts with distributed shared memory access, in accordance with embodiments of the present invention. System 600 of FIG. 6 illustrates hosts 608a . . . 608n comprising associated operators and processing elements 612a . . . 612n being executed within a job. A job may be stated and stopped from the framework. Jobs may be executed at more than one host. Therefore, the framework may provide very high flexibility and scalability. One job may act as a shared memory writer. Additional jobs may read data provided in shared memory 630a . . . 630c. Write access to shared memory 630a . . . 630c must be exclusive. Therefore an overall scheduler (i.e., using application control operators) may be necessary to control write access. Write operations are controlled by an application control master operator 601 and each reader job is controlled with an application control slave operator 603. A control flow is established between application control master operator 601 and application control slave operator 603. A read operation is disabled until the writer has finished all write operations resulting in the following global processing states:

1. Initialization-reader and writer: initialization is running.
2. Stop: A reader job may read data but the readers are advised to stop the operation. A reader initialization may run.
3. Stopped: No reader operation. The writer may access shared memory.
4. Start: The writer has finished writing and the readers may start with read operations.
5. Run: Read operation is in progress. Data processing jobs are in progress.
6. Terminate: Shut down of jobs.

After start-up of jobs, states are passed from initialization, stop, stopped, start to run. During a state of 'Stopped', initial data are written into shared memory. When an update of a shared memory state is necessary, a writer job initializes a state change from run to stop and stopped thereby allowing shared memory to be (over)written. When an update of shared memory is finished, the writer initializes a state change from stopped to start and run. Data processing jobs are performed in a processing chain. Due to performance requirements, data processing jobs may comprise multiple processing chains. The processing chains are allowed to access shared memory only during a state of 'Run'. All data that are to be stored in shared memory are prepared in an inlet portion of the shared memory writer job. When the data are written to shared memory they are passed through a special split operator which distributes the data to all hosts with access to shared memory. This split operator ensures 'synchronism' of shared memory content at all hosts. The hosts with shared memory functionality may run different data processing jobs which may require different data to be stored in shared memory. The split operation ensures that the shared memory data are distributed to those hosts that require a specific piece of data. The split operation ensures that all hosts with the same functionality receive the same pieces of data.

Figure 7:
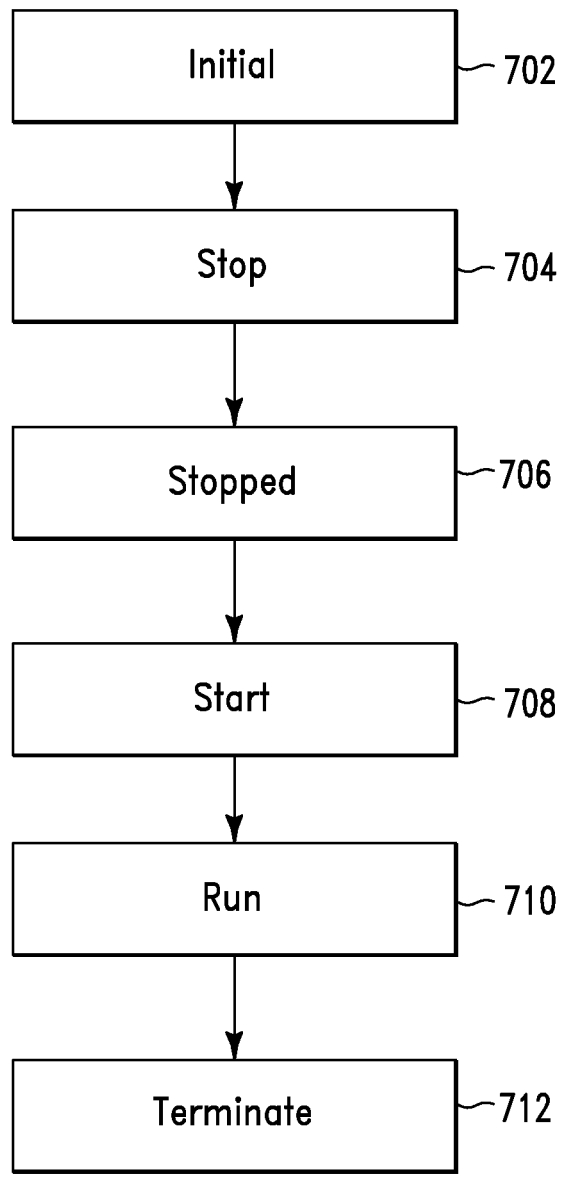
FIG. 7 illustrates an algorithm detailing a process flow enabled by the systems of FIGS. 1-6, in accordance with embodiments of the present invention.

FIG. 7 illustrates an algorithm detailing a process flow enabled by the systems of FIGS. 1-6, in accordance with embodiments of the present invention. Each of the steps in the algorithm of FIG. 7 may be enabled and executed by a computer processor executing computer code. In step 702, an initial function is initiated causing a reader and writer initialization to be running. In step 704, a stop function is initiated. In response, a reader job may read data but readers are advised to stop operation. A reader initialization may run. In step 706, a stopped function is initiated. In response, there is no reader operation. The writer may access shared memory. In step 708, a start function is initiated. In response, a writer has finished writing and readers may start with read operations. In step 710, a run operation is initiated. In response, a read operation and data processing jobs are in progress. In step 712, a terminate function is initiated resulting in a shutdown of jobs. After initialization of shared memory, the writer may again access shared memory and update the content in shared memory. This is accomplished with a state change from 'Run' to 'Stop'.

Figure 8A:
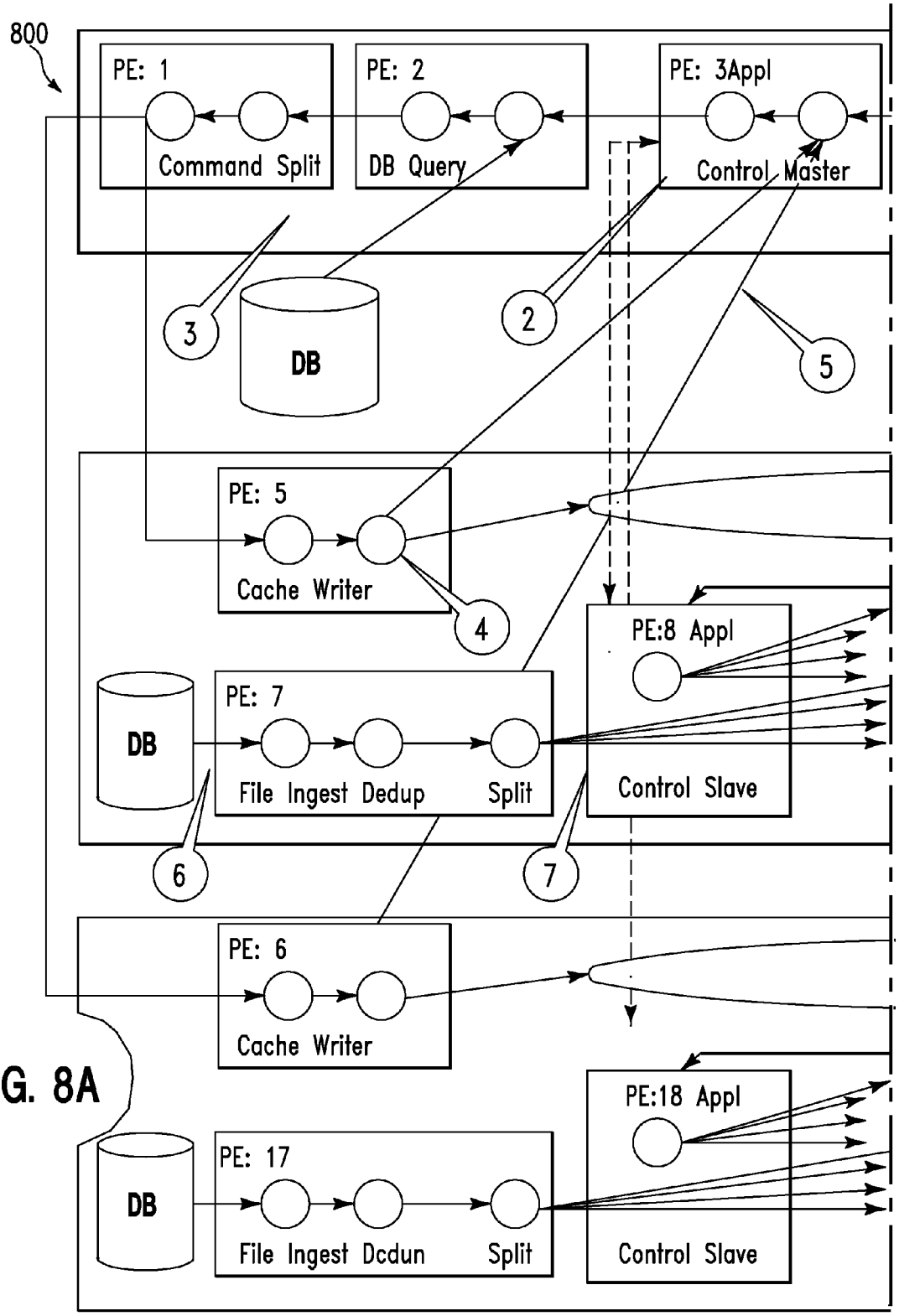
Figure 8B:
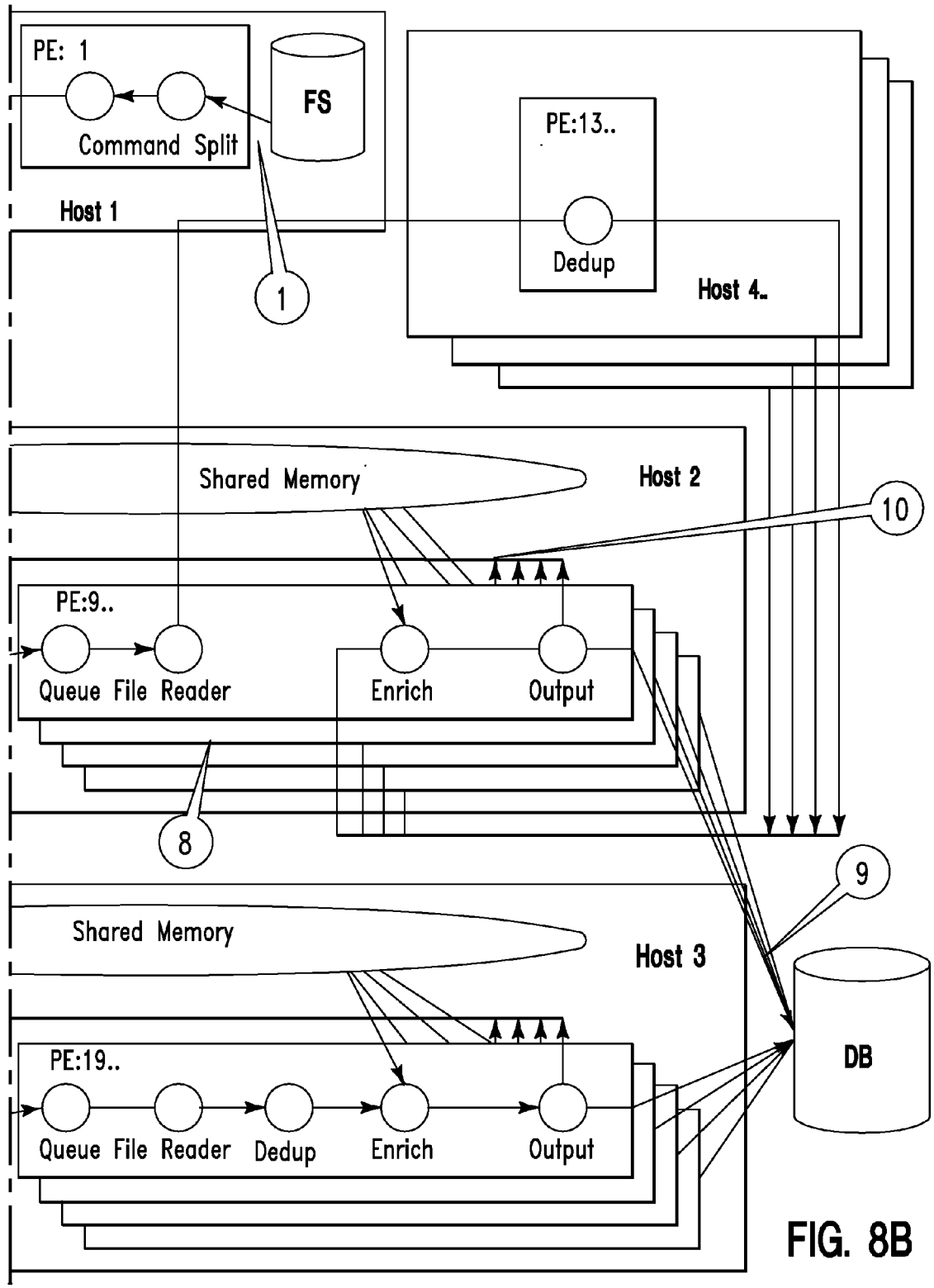

FIG. 8, including FIGS. 8A-8C, illustrates a system 800 for implementing a shared memory access process, in accordance with embodiments of the present invention.

1. System 800 enables a command file to be dropped into an input directory. The command is analyzed and a database table to be read is determined.
2. A command tuple passes an application control master operator. Any further processing of the tuple depends on an application state. The command is passed in state 'Stopped'. In alternative states, the command is queued and application control attempts a state transition into state 'Stopped. An end of the command execution is monitored. When the command execution finishes and there is no further command queued, a state transition into state 'Run' is initialized.
3. The command is passed to a database query operator, appropriate tables are read from the database, and the content of tables is passed line by line to a split operator. The tuples are replicated to all hosts with 'Cache Writer' functionality.
4. Content is written into shared memory line by line.
5. A final signal is submitted to the application control when the read operation finishes. A statistic is generated and the command file is moved into an archive directory.
6. The data processing job scans the input directory continuously. A new filename is recognized and an initial processing process is performed. Duplicate files are filtered out.
7. Filenames are passed to the split operator (e.g., passed to an appropriate processing chain). A filename tuple is queued in a chain control operator. The chain control operator de-queues the filenames into the processing chain once the execution of the previous file has finished and if the application is in a state of 'Run'. In additional states, nothing is de-queued.
8. The input file is read line by line and data processing is initiated.
9. Any results are written into a database or files.
10. An end of the file processing is signaled to a chain control and application control and statistics are generated.

Figure 9:
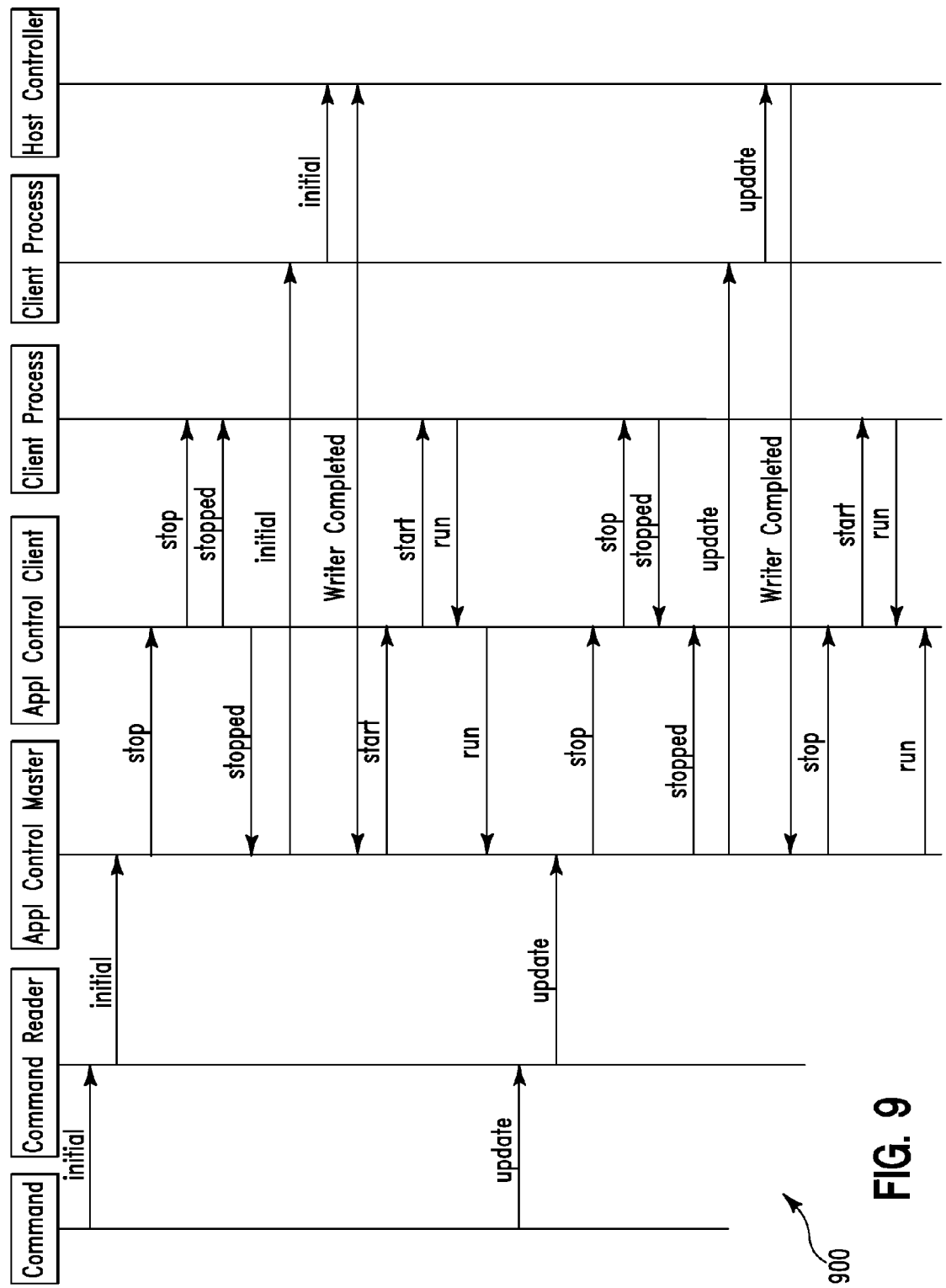
FIG. 9 illustrates an algorithm detailing an application control flow chart, in accordance with embodiments of the present invention.

FIG. 9 illustrates an algorithm detailing an application control flow chart 900, in accordance with embodiments of the present invention. Application control flow chart 900 describes a sequence of actions between shared memory writer operators and shared memory reader operators. The application control master (i.e., part of the writer operators) is responsible for controlling slave processes. During the write processing, all reader processes are stopped, resulting in the consistence of data in shared memory for reading operators. The application control master and application control client follow a described state logic of the application. A command 'initial' is detected by a command reader and forwarded to the application control master that disables the slaves. The application control client responds with a 'stopped' state after client processing has stopped. The application control master forwards the 'initial' command to a command splitter when all clients have stopped. The command splitter splits the command to required single segment requests and forwards the information to host controllers. The host containers check the write results and response to the application control master once all required segments are written and finalized. The application control master sends the start request to the clients thereby setting its state to start. The clients respond with state run. Once all clients have been started, the master changes the state to run. The aforementioned procedure is required to update the date in the shared memory.

Figure 10B:
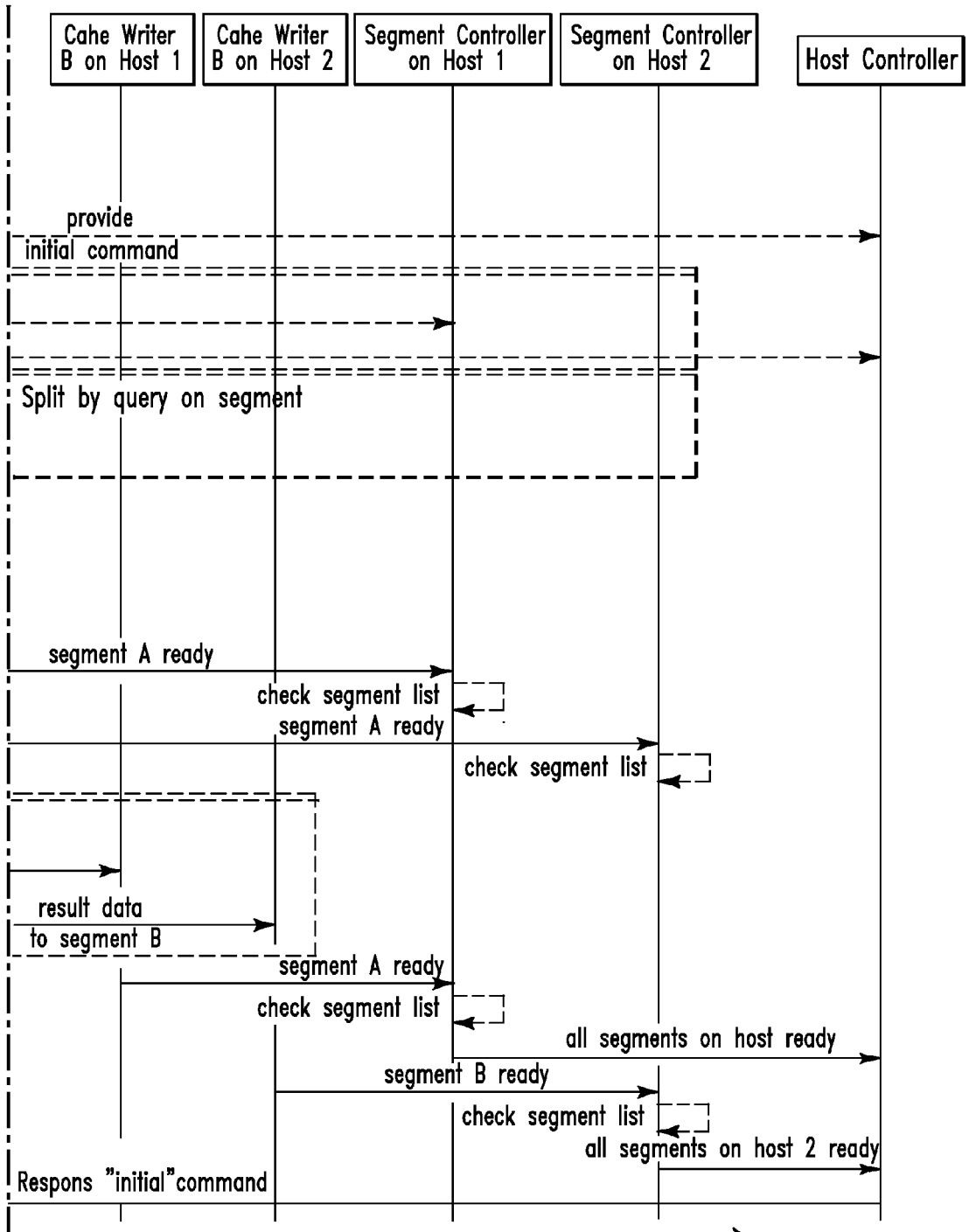

FIG. 10, including FIGS. 10A-10B, illustrates an algorithm detailing a shared memory initial sequence flow chart 1000, in accordance with embodiments of the present invention. Shared memory initial sequence flow chart 1000 describes a process in which an application control master forwards an initial command to a command splitter and provides the command to a host controller announcing the initial command on hosts. The command splitter detects required memory segments (e.g., A and B) and transmits the list to each segment controller on each host announcing processes on segments. In parallel, the command splitter triggers database operators to look up segment data starting queries in the database or reading data files. A database operator for each segment provides results, tuple by tuple, to cache writer operators located on each host. Each cache writer reports finalized write processing to a segment controller on each host. The segment controllers compare the results with a provided list of segments. If all listed segments are ready, then the segment controller reports finalization of all segments on the host to the host controller. Once all hosts report the finalization, the host controller transmits an acknowledge to the application control master resulting in initiation of the clients.

Figure 11A:
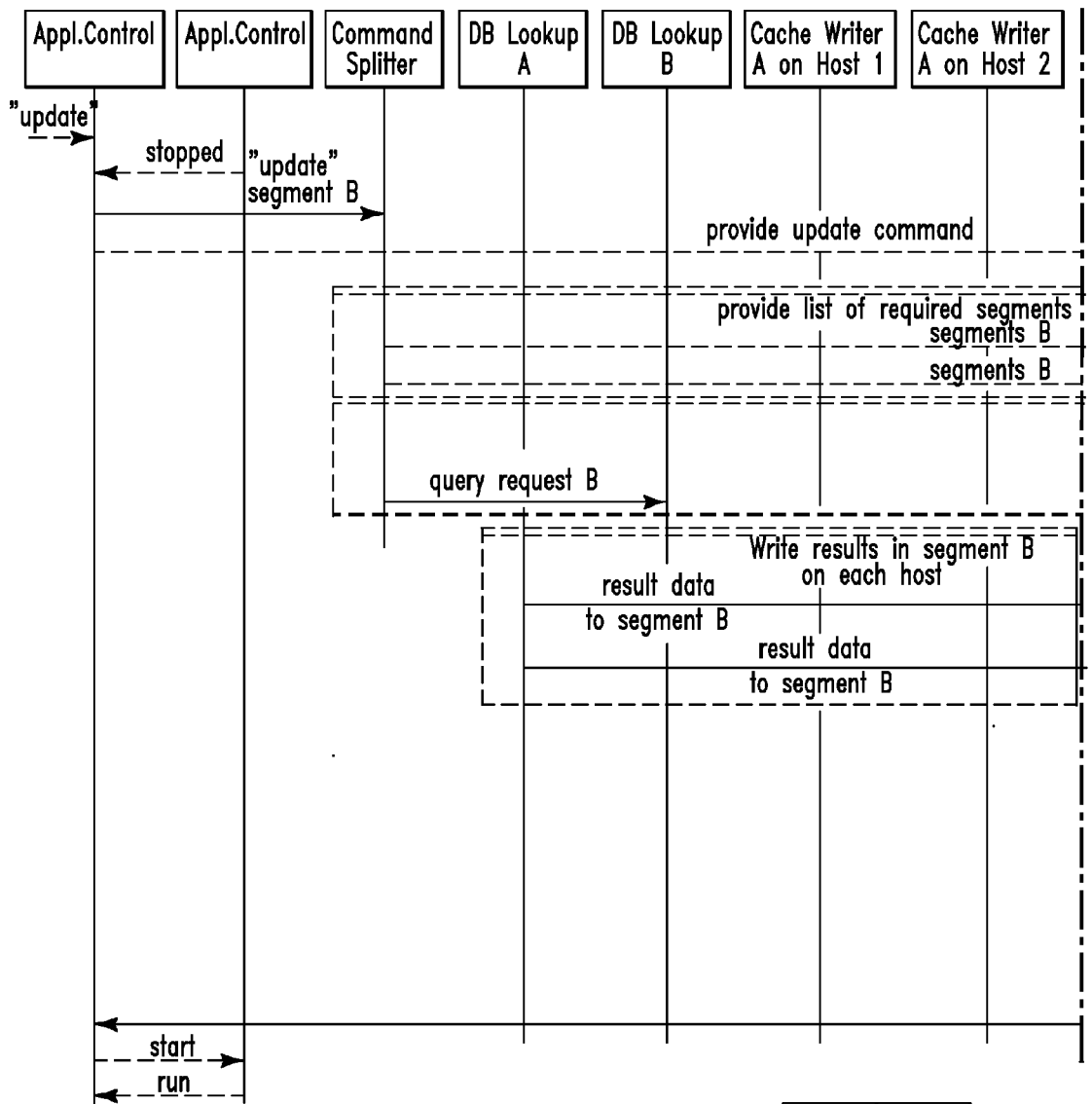
FIGS. 11A-11B, illustrates an algorithm detailing a shared memory update sequence flow chart, in accordance with embodiments of the present invention.
Figure 11:
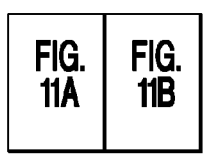
FIG. 11, including
Figure 11B:
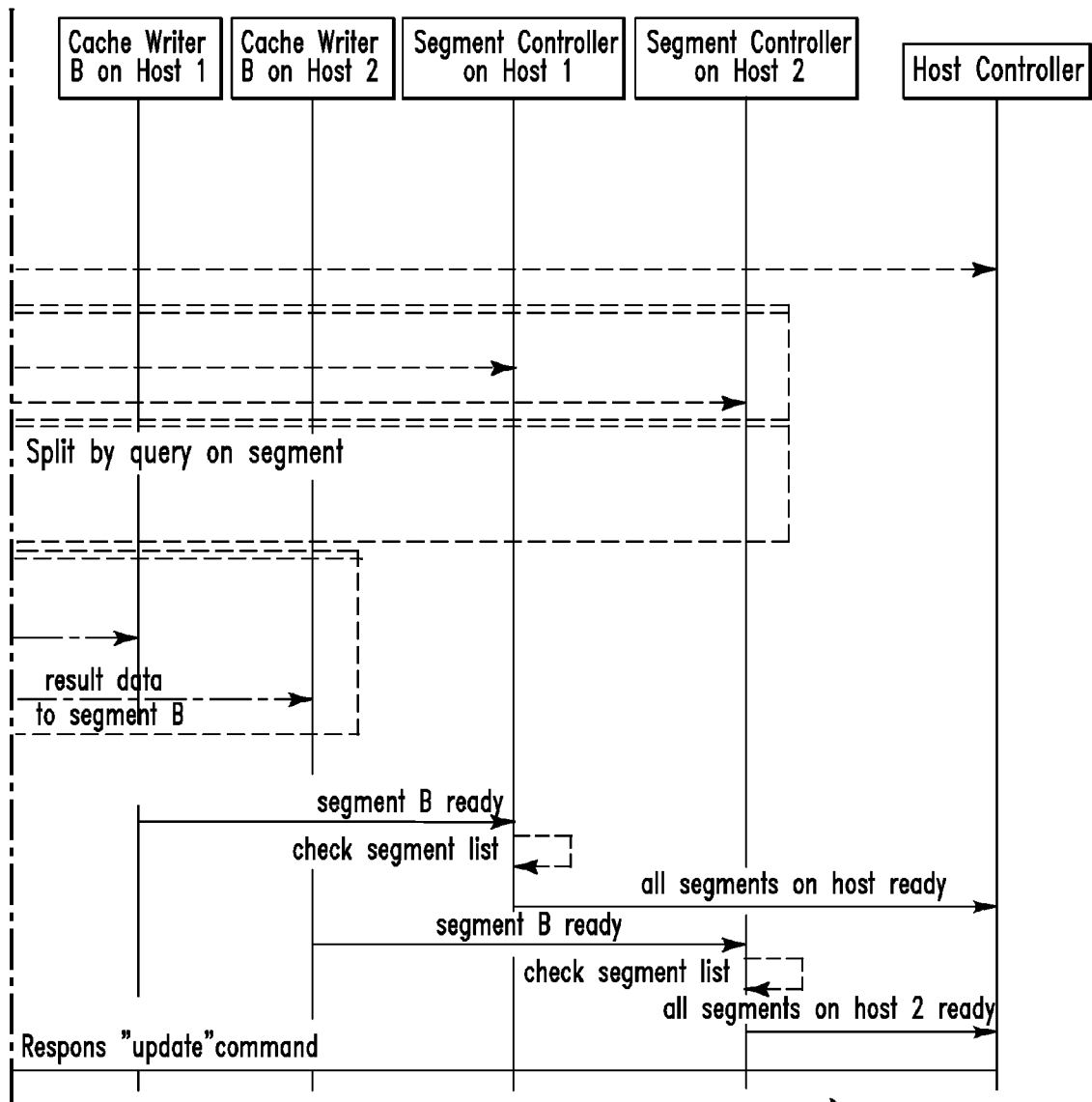

FIG. 11, including FIGS. 11A-11B, illustrates an algorithm detailing a shared memory update sequence flow chart 1100, in accordance with embodiments of the present invention. Shared memory update sequence flow chart 1100 describes processing with respect to an 'initial' command.

Figures 12, 12A:
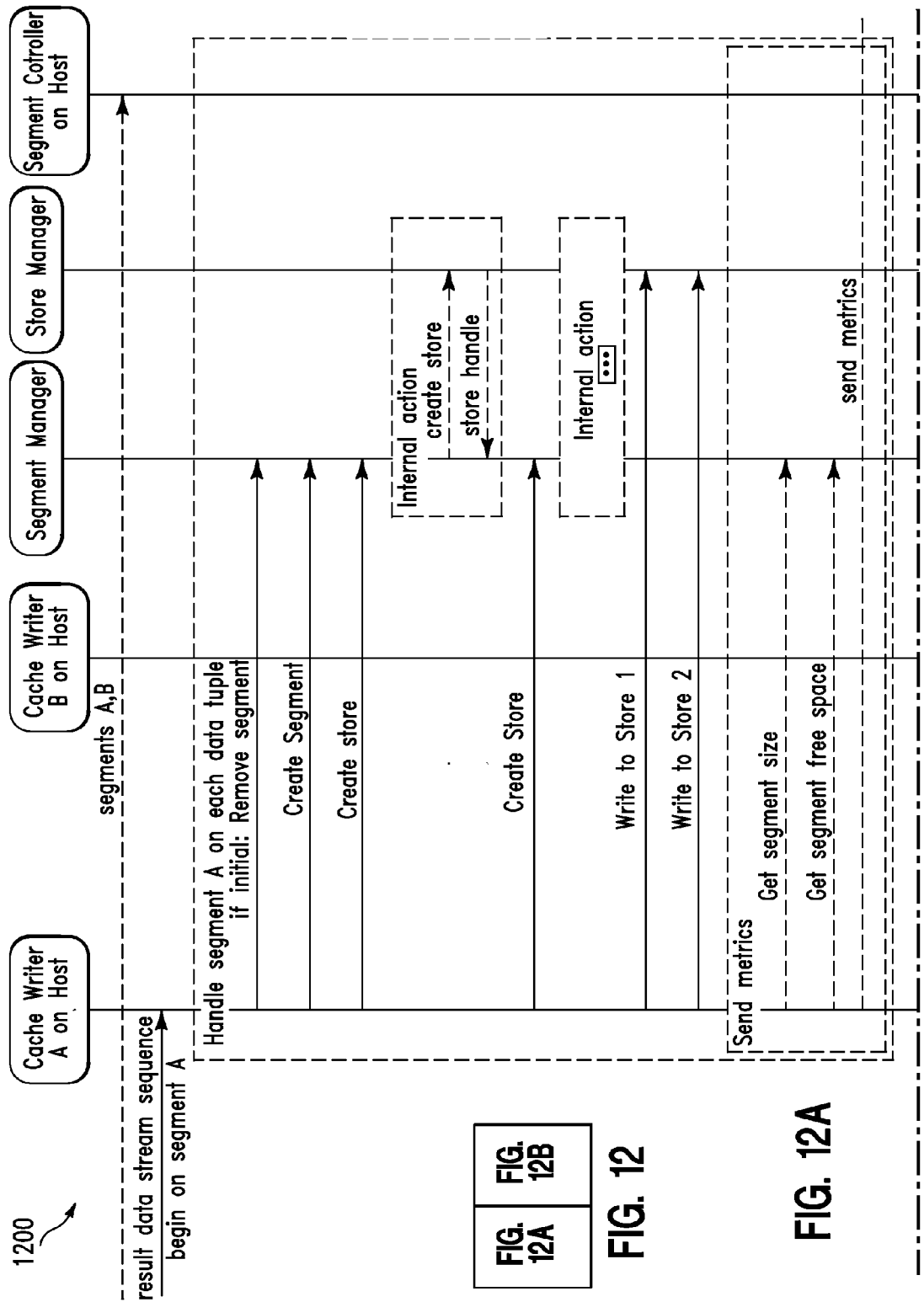
FIG. 12, including
FIGS. 12A-12B, illustrates an algorithm detailing a shared memory access at a cache writer flow chart, in accordance with embodiments of the present invention.
Figure 12B:
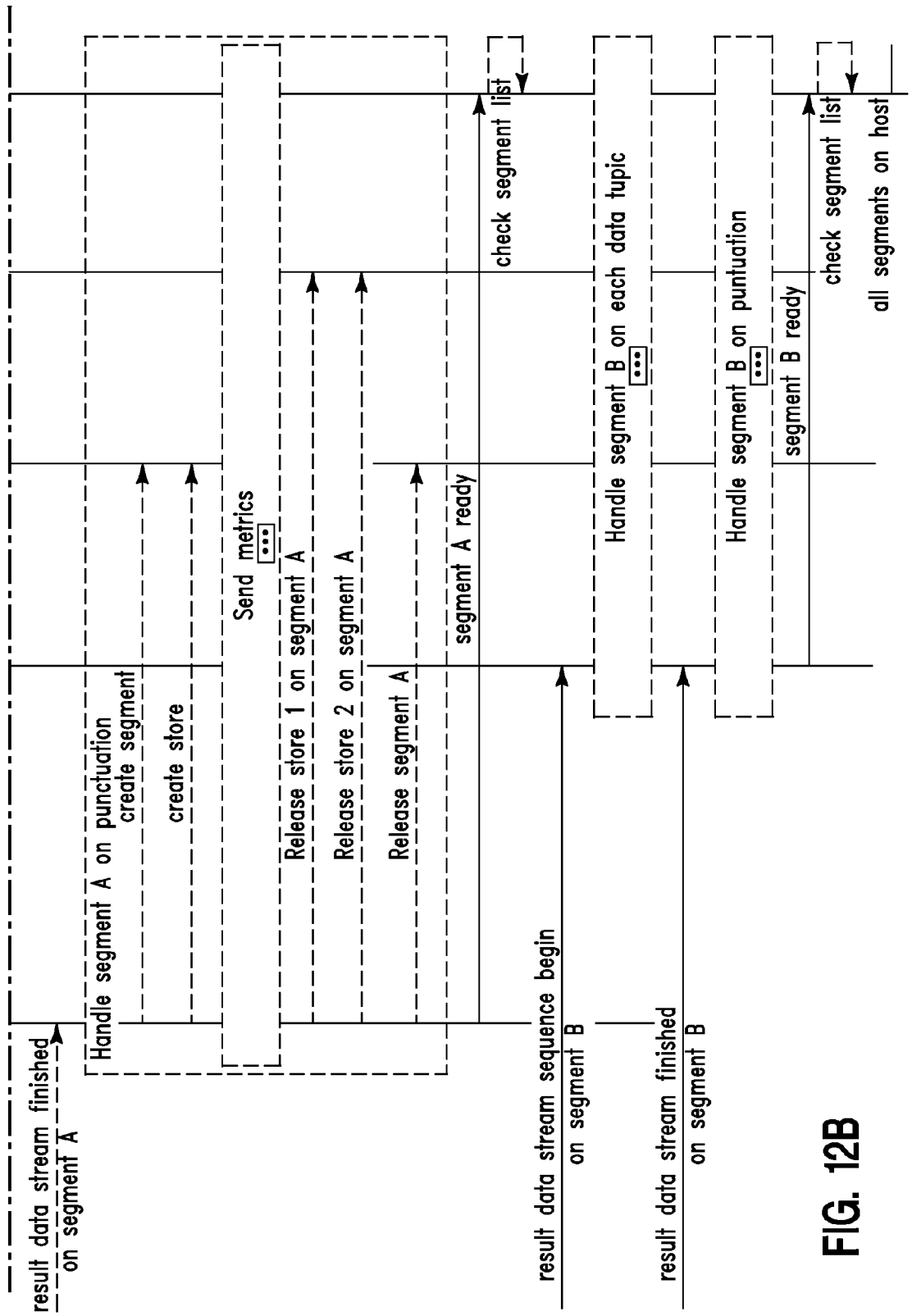

FIG. 12, including FIGS. 12A-12B, illustrates an algorithm detailing a shared memory access at a cache writer flow chart 1200, in accordance with embodiments of the present invention. Shared memory access at a cache writer flow chart 1200 describes a process in which a cache writer receives a set of tuples with data to be written to shared memory. In example of first data set on initial command, addressed segments will be removed from shared memory. In a next step, the segment will be created by a segment manager. The segment may collect one or more stores, where the data are stored in form of vectors or maps of data types. The segment manager creates the stores by exchanging the data with the store manager. The data may be stored within the store by calling supporting shared memory functions. Additionally, metrics associated with a size of the segments are requested and sent to the system. After the last data set arrives, the addressed segment and each store are opened and final metrics will be sent. The stores will be released by supporting functions and the addressed segments will be released. The data will stay semi-persistent in shared memory and the aforementioned process will be repeated for each segment on each host.

Figure 13:
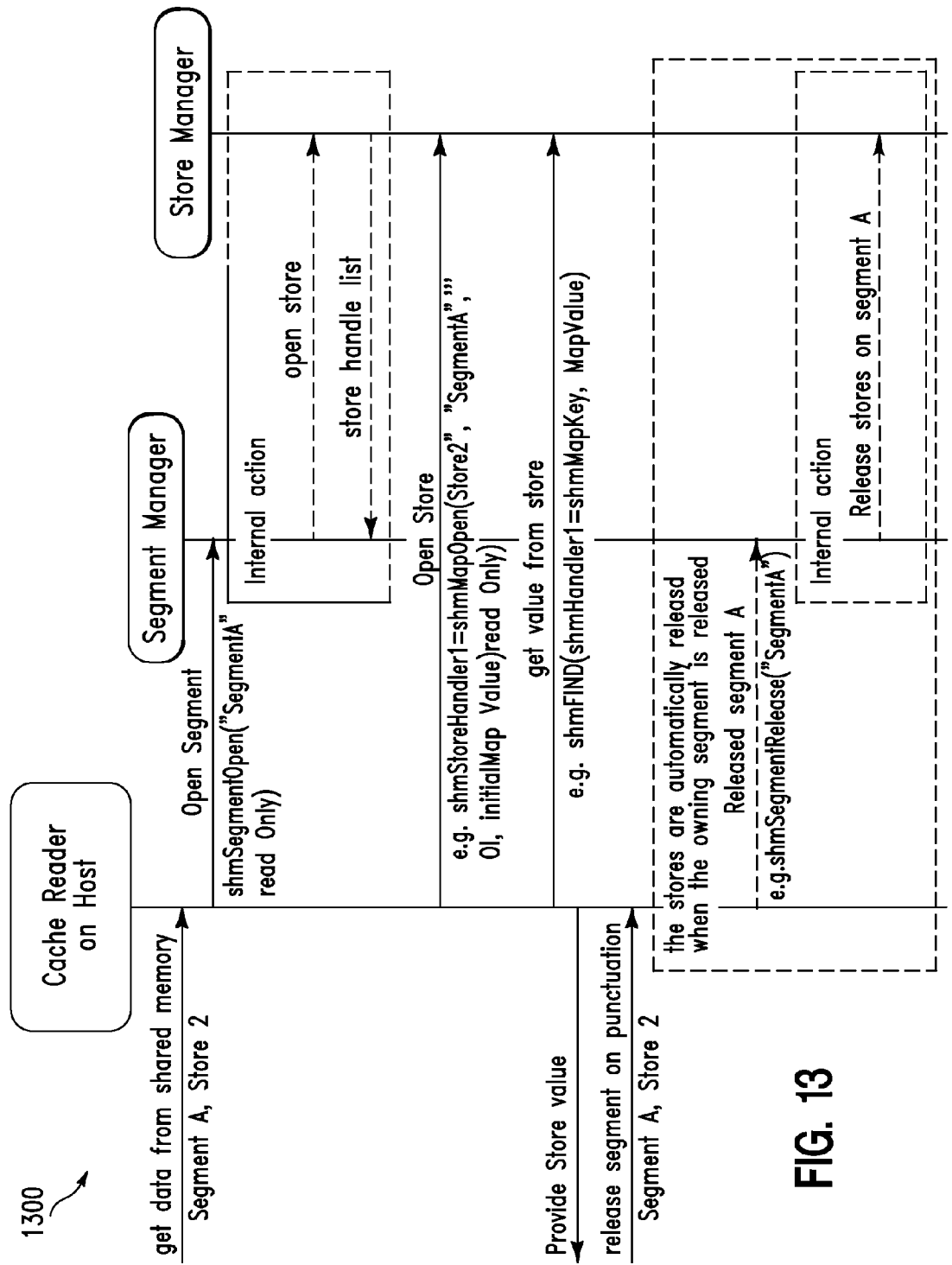
FIG. 13 illustrates an algorithm detailing a shared memory access at a cache reader flow chart, in accordance with embodiments of the present invention.

FIG. 13 illustrates an algorithm detailing a shared memory access at a cache reader flow chart 1300, in accordance with embodiments of the present invention. Shared memory access at a cache reader flow chart 1300 describes a process in which a request to read shared memory could be requested. In this case, the client reader operator calls the shared memory function to open the required segment. Upon opening the segment, the list of stores will be provided to a segment manager. In a next step, the required store comprising the requested data must be opened. Using a supporting function, a value will be provided to a client operator process by a store manager. Upon finalizing access to the shared memory, the segment will be released thereby releasing all open stores of this segment.

Figure 14:
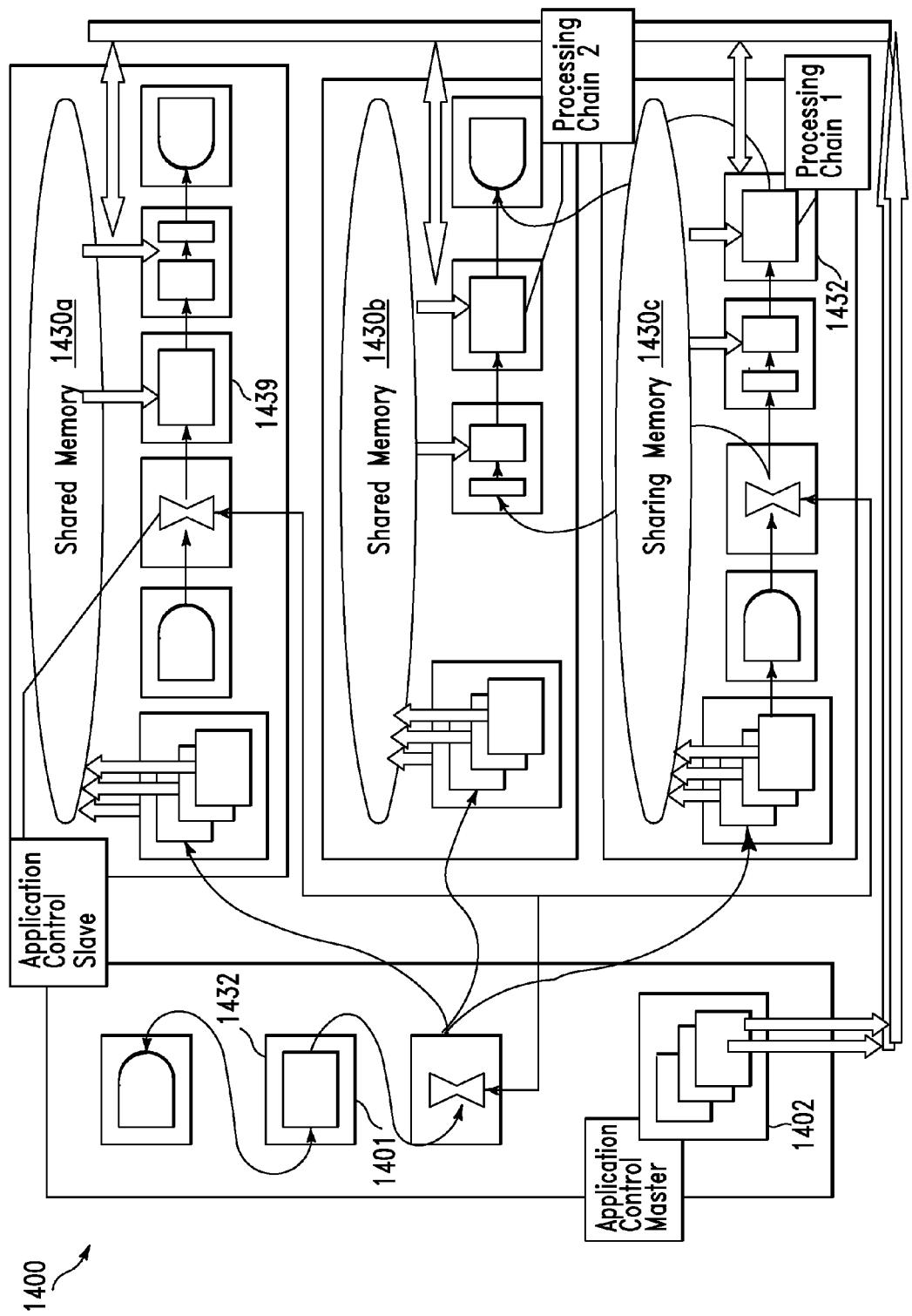
FIG. 14 illustrates a system for implementing a shared memory development process, in accordance with embodiments of the present invention.

FIG. 14 illustrates a system 1400 for implementing a shared memory development process, in accordance with embodiments of the present invention. System 1400 describes an external memory structure that may be shared across all operators through a common protocol. Data transport to and from the external memory may be provided by, for example, remote direct memory access (RDMA).

Figure 15:
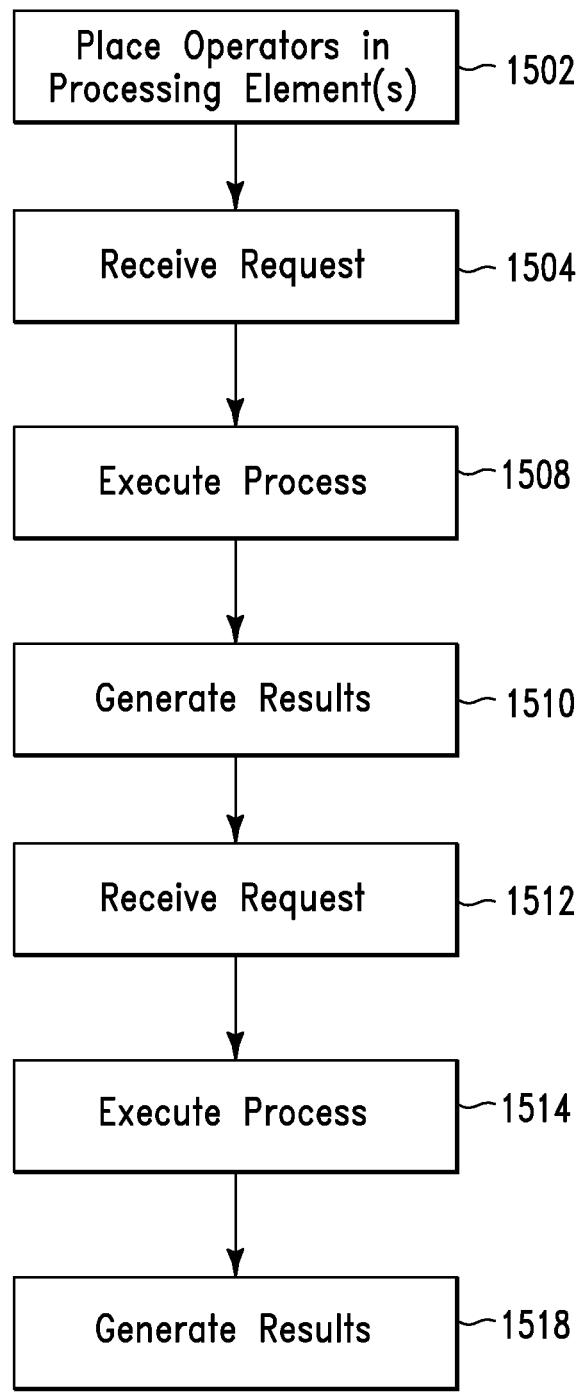
FIG. 15 illustrates an algorithm detailing a method for sharing global data stored in a shared memory module, in accordance with embodiments of the present invention.

FIG. 15 illustrates an algorithm detailing a method for sharing global data stored in a shared memory module, in accordance with embodiments of the present invention. Each of the steps in the algorithm of FIG. 15 may be enabled and executed by a computer processor executing computer code. In step 1502, a first operator and a second operator are placed within a first processing element (or alternatively different processing elements). The first operator includes first local data and the second operator includes second local data. The first operator is associated with a first host of a distributed computing system and the second operator is associated with a second host (and differing) of the distributed computing system. In step 1504, a computer processor receives (from the first operator within the first processing element) a first request for usage of first global data with respect to a first process. The first global data is semi-persistently stored within a specified segment of a shared memory module. In step 1508, the first operator within the first processing element executes in response to the first request, the first process with respect to the first global data semi-persistently stored within the specified portion of the shared memory module. In step 1510, results of step 1508 are generated. In step 1512, the computer processor receives (from the second operator within the first processing element) a second request for usage of the first global data with respect to a second process differing from the first process. In step 1514, the second operator within the second processing element executes in response to the second request, the second process with respect to the first global data semi-persistently stored within the specified segment of the shared memory module. The shared memory module comprises shared memory space being shared by the first operator and the second operator. In step 1518, results of step 1514 are generated.

Figure 16:
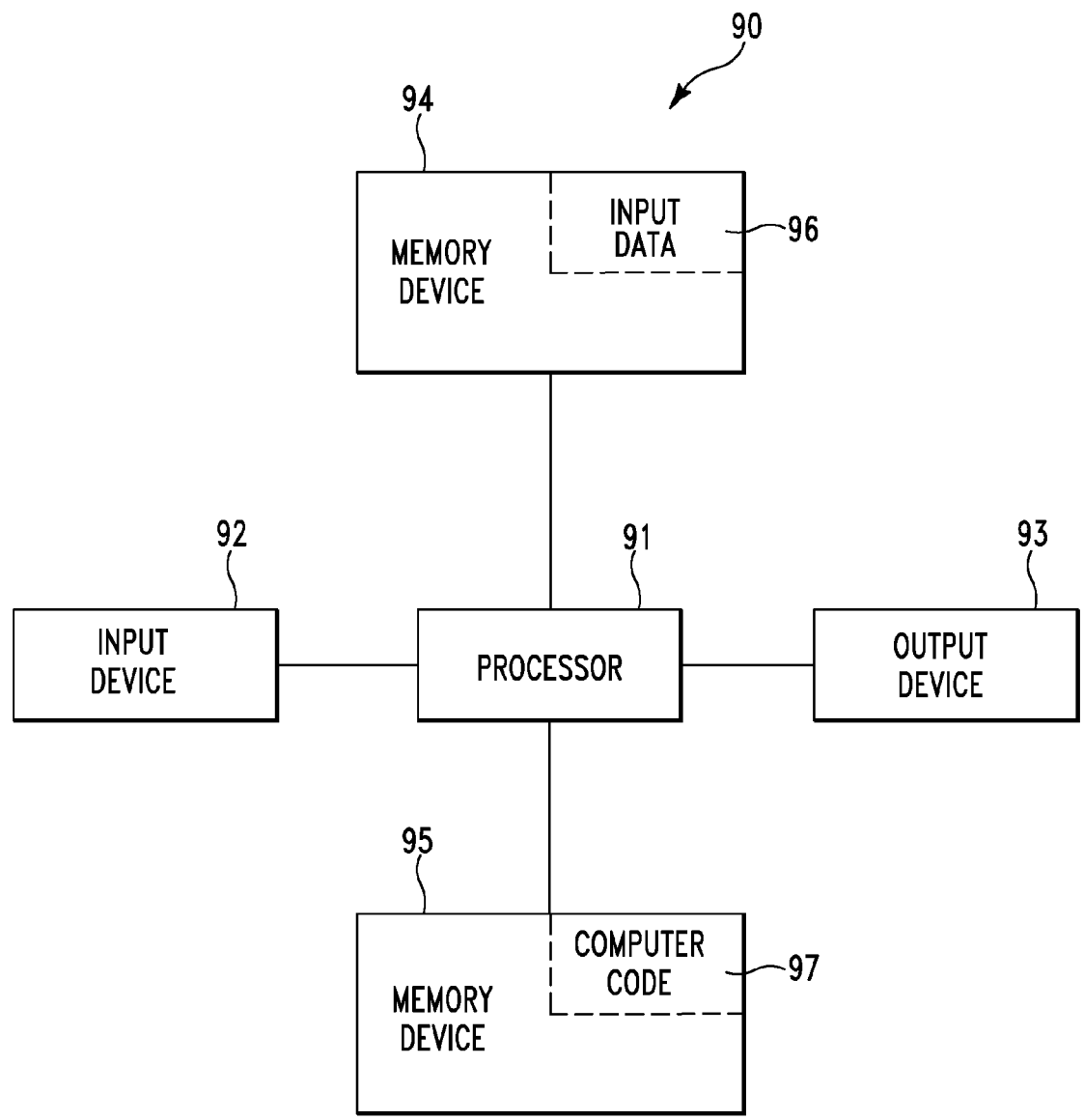
FIG. 16 illustrates a computer apparatus used by the systems and processes of FIGS. 1-15 for sharing global data stored in a shared memory module, in accordance with embodiments of the present invention.

FIG. 16 illustrates a computer apparatus 90 used by the systems and processes of FIGS. 1-15 for sharing global data stored in a shared memory module, in accordance with embodiments of the present invention. The computer system 90 includes a processor 91 (or processors in computer systems with multiple processor architecture), an input device 92 coupled to the processor 91, an output device 93 coupled to the processor 91, and memory devices 94 and 95 each coupled to the processor 91. The input device 92 may be, inter alia, a keyboard, a mouse, etc. The output device 93 may be, inter alia, a printer, a plotter, a computer screen, a magnetic tape, a removable hard disk, a floppy disk, etc. The memory devices 94 and 95 may be, inter alia, a hard disk, a floppy disk, a magnetic tape, an optical storage such as a compact disc (CD) or a digital video disc (DVD), a dynamic random access memory (DRAM), a read-only memory (ROM), etc. The memory device 95 includes a computer code 97. The computer code 97 includes algorithms (e.g., the algorithms of FIGS. 7, 9-13, and 15) for sharing global data stored in a shared memory module. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices not shown in FIG. 16) may include the algorithm of FIGS. 7, 9-13, and 15 and may be used as a computer usable medium (or a computer readable medium or a program storage device) having a computer readable program code embodied therein and/or having other data stored therein, wherein the computer readable program code includes the computer code 97. Generally, a computer program product (or, alternatively, an article of manufacture) of the computer system 90 may include the computer usable medium (or the program storage device).

Still yet, any of the components of the present invention could be created, integrated, hosted, maintained, deployed, managed, serviced, etc. by a service supplier who offers to share global data stored in a shared memory module. Thus the present invention discloses a process for deploying, creating, integrating, hosting, maintaining, and/or integrating computing infrastructure, including integrating computer-readable code into the computer system 90, wherein the code in combination with the computer system 90 is capable of performing a method for sharing global data stored in a shared memory module. In another embodiment, the invention provides a business method that performs the process steps of the invention on a subscription, advertising, and/or fee basis. That is, a service supplier, such as a Solution Integrator, could offer to share global data stored in a shared memory module. In this case, the service supplier can create, maintain, support, etc. a computer infrastructure that performs the process steps of the invention for one or more customers. In return, the service supplier can receive payment from the customer(s) under a subscription and/or fee agreement and/or the service supplier can receive payment from the sale of advertising content to one or more third parties.

While FIG. 16 shows the computer system 90 as a particular configuration of hardware and software, any configuration of hardware and software, as would be known to a person of ordinary skill in the art, may be utilized for the purposes stated supra in conjunction with the particular computer system 90 of FIG. 16. For example, the memory devices 94 and 95 may be portions of a single memory device rather than separate memory devices.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A method comprising:
   placing, by a computer processor, a first operator and a second operator within a first processing element of said computer processor, said first operator comprising first local data, said second operator comprising second local data, said first operator associated with a first host of a distributed computing system, said second operator associated with a second host of said distributed computing system, said first host differing from said second host;
   receiving, by said computer processor from said first operator within said first processing element, a first request for usage of first global data with respect to a first process, said first global data semi-persistently stored within a specified segment of a shared memory module;
   passing, by said computer processor, said first global data through a split operator module;
   first executing in response to said first request via said split operator module, by said computer processor executing said first operator within said first processing element, said first process with respect to said first global data semi-persistently stored within said specified segment of said shared memory module, wherein said shared memory module comprises a RAM stack;
   generating, by said computer processor, results of said first executing;
   receiving, by said computer processor from said second operator within said first processing element, a second request for usage of said first global data with respect to a second process differing from said first process;
   second executing in response to said second request via said split operator module, by said computer processor executing said second operator within said second processing element, said second process with respect to said first global data semi-persistently stored within said specified segment of said shared memory module, wherein said shared memory module comprises shared memory space being shared by said first operator and said second operator;
   generating, by said computer processor, results of said second executing;
   controlling, by said computer processor executing an application control master module, write functions of said first process and said second process, wherein said application control master module is located external to said first host and said second host;
   controlling, by said computer processor executing said application control master module with respect to an application control slave module, read functions of said first process and said second process;
   initializing, by said computer processor executing said application control master module, a state change, for said shared memory module, from a run state to a stop state resulting in said first global data being overwritten and updated within said shared memory module;
   determining, by said computer processor, that said first global data has been overwritten and updated; and
   initializing, by said computer processor executing said application control master module, an additional state change, for said shared memory module, from said stop state to said run state.

2. The method of claim 1, further comprising:
   receiving, by said computer processor from a third operator within a second processing element differing from said first processing element, a third request for usage of said first global data with respect to a third process differing from said first process and said second process, said third operator comprising third local data said third operator associated with a third host of said distributed computing system, said third host differing from said first host and said second host;
   third executing in response to said third request, by said computer processor executing said third operator within said second processing element, said third process with respect to said first global data semi-persistently stored within said specified segment of said shared memory module, wherein said shared memory module further comprises shared memory space being shared by said third operator; and
   generating, by said computer processor, results of said third executing.

3. The method of claim 2, further comprising:
synchronizing, by said computer processor, said first operator, said second operator, and said third operator.

4. The method of claim 2, wherein said shared memory module comprises a shared memory structure accessible by said first operator, said second operator, and said third operator.

5. The method of claim 2, wherein each of said first processing element and said second processing element comprises a software logical unit defined by an operating subsystem for managing a cluster of central processing units for performing a distributed processing process.

6. The method of claim 2, further comprising:
controlling, by said computer processor executing an application control module, read/write functions of said third process.

7. The method of claim 2, wherein said first process, said second process, and said third process are executed simultaneously.

8. The method of claim 2, wherein each of said first operator, said second operator, and said third operator comprises software code for processing data.

9. The method of claim 2, wherein first processing element and said second processing element are comprised by a job configured to be executed by said first host, said second host, and said third host.

10. The method of claim 1, wherein said first global data is transferred to said first operator and said second operator via an input/output data stream as a tuple.

11. The method of claim 1, wherein said specified segment of said shared memory module is organized into shared memory stores.

12. The method of claim 11, wherein said shared memory stores comprise a plurality of memory stores created as a multi-store object, wherein a global index, a local index, and an application control module are configured to enable access to said multi-store object.

13. The method of claim 12, further comprising:
controlling, by a logic processing object executing a plurality of inter-process mutual exclusion objects, access to said multi-store object.

14. The method of claim 13, wherein said logic processing object executes a non-recursive method comprising an exclusive lock, a recursive lock, sharable locks, and upgradable locks.

15. The method of claim 13, wherein said logic processing object is stored within said specified segment of said shared memory module.

16. The method of claim 13, wherein said logic processing object is stored within said specified segment of said shared memory module, and wherein said shared memory stores are configured to be triggered to be refreshed through application control at user specified time intervals.

17. The method of claim 1, wherein said shared memory module comprises a remote memory module external to and accessible by said first host and said second host.

18. The method of claim 1, wherein said first global data is accessible by said first operator, said second operator, said first host, and said second host via application control logic and mutual exclusion logic.

19. A computer program product, comprising a computer readable hardware storage device storing a computer readable program code, said computer readable program code comprising an algorithm that when executed by a computer processor of a computer system implements a method, said method comprising:

placing, by said computer processor, a first operator and a second operator within a first processing element of said computer processor, said first operator comprising first local data, said second operator comprising second local data, said first operator associated with a first host of a distributed computing system, said second operator associated with a second host of said distributed computing system, said first host differing from said second host;

receiving, by said computer processor from said first operator within said first processing element, a first request for usage of first global data with respect to a first process, said first global data semi-persistently stored within a specified segment of a shared memory module;

passing, by said computer processor, said first global data through a split operator module;

first executing in response to said first request via said split operator module, by said computer processor executing said first operator within said first processing element, said first process with respect to said first global data semi-persistently stored within said specified segment of said shared memory module, wherein said shared memory module comprises a RAM stack;

generating, by said computer processor, results of said first executing;

receiving, by said computer processor from said second operator within said first processing element, a second request for usage of said first global data with respect to a second process differing from said first process;

second executing in response to said second request via said split operator module, by said computer processor executing said second operator within said second processing element, said second process with respect to said first global data semi-persistently stored within said specified segment of said shared memory module, wherein said shared memory module comprises shared memory space being shared by said first operator and said second operator;

generating, by said computer processor, results of said second executing;

controlling, by said computer processor executing an application control master module, write functions of said first process and said second process, wherein said application control master module is located external to said first host and said second host;

controlling, by said computer processor executing said application control master module with respect to an application control slave module, read functions of said first process and said second process;

initializing, by said computer processor executing said application control master module, a state change, for said shared memory module, from a run state to a stop state resulting in said first global data being overwritten and updated within said shared memory module;

determining, by said computer processor, that said first global data has been overwritten and updated; and initializing, by said computer processor executing said application control master module, an additional state change, for said shared memory module, from said stop state to said run state.

20. A computer system comprising a computer processor coupled to a computer-readable memory unit, said memory unit comprising instructions that when executed by the computer processor implements a method comprising:

placing, by said computer processor, a first operator and a second operator within a first processing element of said computer processor, said first operator comprising first local data, said second operator comprising second local data, said first operator associated with a first host of a distributed computing system, said second operator associated with a second host of said distributed computing system, said first host differing from said second host;

receiving, by said computer processor from said first operator within said first processing element, a first request for usage of first global data with respect to a first process, said first global data semi-persistently stored within a specified segment of a shared memory module;

passing, by said computer processor, said first global data through a split operator module;

first executing in response to said first request via said split operator module, by said computer processor executing said first operator within said first processing element, said first process with respect to said first global data semi-persistently stored within said specified segment of said shared memory module, wherein said shared memory module comprises a RAM stack;

generating, by said computer processor, results of said first executing;

receiving, by said computer processor from said second operator within said first processing element, a second request for usage of said first global data with respect to a second process differing from said first process;

second executing in response to said second request via said split operator module, by said computer processor executing said second operator within said second processing element, said second process with respect to said first global data semi-persistently stored within said specified segment of said shared memory module, wherein said shared memory module comprises shared memory space being shared by said first operator and said second operator;

generating, by said computer processor, results of said second executing;

controlling, by said computer processor executing an application control master module, write functions of said first process and said second process, wherein said application control master module is located external to said first host and said second host;

controlling, by said computer processor executing said application control master module with respect to an application control slave module, read functions of said first process and said second process;

initializing, by said computer processor executing said application control master module, a state change, for said shared memory module, from a run state to a stop state resulting in said first global data being overwritten and updated within said shared memory module;

determining, by said computer processor, that said first global data has been overwritten and updated; and initializing, by said computer processor executing said application control master module, an additional state change, for said shared memory module, from said stop state to said run state.

\* \* \* \* \*